(12) United States Patent
Kerzman et al.

(10) Patent No.: US 6,546,532 B1
(45) Date of Patent: Apr. 8, 2003

(54) METHOD AND APPARATUS FOR TRAVERSING AND PLACING CELLS USING A PLACEMENT TOOL

(75) Inventors: Joseph Peter Kerzman, New Brighton, MN (US); James Edward Rezek, Mounds View, MN (US)

(73) Assignee: Unisys Corporation, Blue Bell, PA (US)

( * ) Notice: Subject to any disclaimer, the term of this patent is extended or adjusted under 35 U.S.C. 154(b) by 158 days.

(21) Appl. No.: 09/597,978

(22) Filed: Jun. 20, 2000

(51) Int. Cl.[7] .............................................. G06F 17/50
(52) U.S. Cl. ................................ 716/8; 716/10; 716/11
(58) Field of Search ........................... 716/8–14, 17–18, 716/1–3, 6, 16, 5

(56) References Cited

U.S. PATENT DOCUMENTS

| | | | |
|---|---|---|---|
| 4,758,953 A | 7/1988 | Morita et al. ................. 364/300 |
| 4,831,543 A | 5/1989 | Mastellone .................... 364/489 |
| 4,918,614 A | 4/1990 | Modarres et al. ............. 364/490 |
| 5,050,091 A | 9/1991 | Rubin ............................ 364/488 |
| 5,155,836 A | 10/1992 | Jordan et al. ................ 395/500 |
| 5,164,908 A | 11/1992 | Igarashi ........................ 364/491 |
| 5,175,696 A | 12/1992 | Hooper et al. ................ 364/489 |
| 5,222,029 A | 6/1993 | Hooper et al. ................ 364/489 |
| 5,255,363 A | 10/1993 | Seyler ........................... 395/164 |
| 5,267,175 A | 11/1993 | Hooper .......................... 364/489 |
| 5,341,309 A | 8/1994 | Kawata .......................... 364/489 |
| 5,349,659 A | 9/1994 | Do et al. ....................... 395/700 |
| 5,355,317 A | 10/1994 | Talbott et al. ................. 384/468 |
| 5,357,440 A | 10/1994 | Talbott et al. ................. 364/467 |
| 5,359,523 A | 10/1994 | Talbott et al. ................. 364/468 |
| 5,359,537 A | 10/1994 | Saucier et al. ................ 364/489 |
| 5,361,357 A | 11/1994 | Kionka .......................... 395/700 |
| 5,398,195 A | 3/1995 | Kim ............................... 364/491 |
| 5,406,497 A | 4/1995 | Altheimer et al. ............ 364/489 |
| 5,416,721 A | 5/1995 | Nishiyama et al. ........... 364/491 |
| 5,418,733 A | 5/1995 | Kamijima ...................... 364/490 |
| 5,418,954 A | 5/1995 | Petrus ............................ 395/700 |
| 5,440,720 A | 8/1995 | Baisuck et al. ............... 395/500 |
| 5,483,461 A | 1/1996 | Lee et al. ...................... 364/490 |
| 5,485,396 A | 1/1996 | Brasen et al. ................. 364/491 |
| 5,490,266 A | 2/1996 | Sturges ......................... 395/500 |
| 5,490,268 A | 2/1996 | Matsunaga .................... 395/550 |
| 5,491,640 A | 2/1996 | Sharna et al. ................. 364/488 |
| 5,493,508 A | 2/1996 | Dangelo et al. ............... 364/489 |
| 5,515,293 A | 5/1996 | Edwards ........................ 364/489 |
| 5,521,836 A | 5/1996 | Hartoog et al. ............... 364/491 |
| 5,568,396 A * | 10/1996 | Bamji et al. ...................... 716/3 |
| 5,663,893 A | 9/1997 | Wampler et al. ............. 364/491 |
| 5,689,433 A | 11/1997 | Edwards ........................ 364/490 |
| 5,696,693 A | 12/1997 | Aubel et al. .................. 364/490 |
| 5,706,295 A | 1/1998 | Suzuki ......................... 371/22.1 |
| 5,712,794 A | 1/1998 | Hong ............................. 364/491 |
| 5,883,811 A * | 3/1999 | Lam .................................. 716/6 |
| 6,058,252 A * | 5/2000 | Noll et al. ...................... 716/10 |
| 6,209,123 B1 * | 3/2001 | Maziasz et al. ............... 716/11 |
| 6,308,309 B1 * | 10/2001 | Gan et al. ...................... 326/39 |

OTHER PUBLICATIONS

Unisys Corporation, "VIM Plan Version 4R13 For Dummies", dated prior to Jun. 20, 2000, 63 pages.
http://www.arcadiadesign.com/mustang.htm, Feb. 29, 2000, 7 pages.

* cited by examiner

*Primary Examiner*—Matthew Smith
*Assistant Examiner*—Paul Dinh
(74) *Attorney, Agent, or Firm*—Charles A. Johnson; Mark T. Starr; Crompton, Seager & Tufte, LLC

(57) ABSTRACT

Method and apparatus for efficiently traversing and placing cells in a circuit design database are disclosed. In one illustrative embodiment, one or more leaf cells are identified as base objects. The base objects are placed and aligned along a selected dominate axis. Once the base objects are identified, an input port is identified by the circuit designer. In many cases, selected base objects will have at least one common input port name, such as "A". By selecting a common input port name, the corresponding input port for each of the selected base objects is identified. Once identified, the source leaf cells that have an output port that is coupled to the identified input ports can be identified, placed and aligned as desired.

29 Claims, 17 Drawing Sheets

```
Select Inputs
  A1[p33u0n0]: Z230EZ@2147<-Z231BZ@2147
  A2[p0u33n0]: Z442EZ@2147<-Z447BZ@2147
  B1[p32u0n0]: Z373EZ@2147<-Z376BZ@2147
  B2[p24u0n0]: Z1244EZ@2147<-Z1282BZ@2147
  C[p15u0n0]: Z1025EZ@2147<-Z1051BZ@2147
  D[p12u3n0]: Z1026EZ@2147<-Z1052BZ@2147

Move Base to Inputs
  A1[p33u0n0]: Z230EZ@2147<-Z231BZ@2147
  A2[p33u0n0]: Z442EZ@2147<-Z447BZ@2147
  B1[p32u0n0]: Z373EZ@2147<-Z376BZ@2147
  B2[p24u0n0]: Z1244EZ@2147<-Z1282BZ@2147
  C[p15u0n0]: Z1025EZ@2147<-Z1051BZ@2147
  D[p12u3n0]: Z1026EZ@2147<-Z1052BZ@2147

Date Path Tree
  Z220BZ [s 33]:  NAND4_A
  FF_0 [s 33]:  LPH0001_B
```

*FIG 6A*

```
Unplaced Inputs
  A2[p0u33n0]: Z442EZ@2147<-Z447BZ@2147
  D[p12u3n0]: Z1026EZ@2147<-Z1052BZ@2147

Placed Inputs
  A1[p33u0n0]: Z230EZ@2147<-Z231BZ@2147
  B1[p32u0n0]: Z373EZ@2147<-Z376BZ@2147
  B2[p24u0n0]: Z1244EZ@2147<-Z1282BZ@2147
  C[p15u0n0]: Z1025EZ@2147<-Z1051BZ@2147
  D[p12u3n0]: Z1026EZ@2147<-Z1052BZ@2147

Date Path Tree
  Z220BZ [s 33]:  NAND4_A
  FF_0 [s 33]:  LPH0001_B
```

*FIG 6B*

METHOD AND APPARATUS FOR TRAVERSING AND PLACING CELLS USING A PLACEMENT TOOL

CROSS REFERENCE TO CO-PENDING APPLICATIONS

The present application is related to U.S. patent application Ser. No. 09/597,529, filed Jun. 20, 2000, entitled "Method And Apparatus For Selecting And Aligning Cells In A Placement Tool", and U.S. patent application Ser. No. 08/789,026, filed Jan. 27, 1997, entitled "Method And Apparatus For Selecting Components Within A Circuit Design Database", both of which are assigned to the assignee of the present invention and both of which are incorporated herein by reference.

TECHNICAL FIELD OF THE INVENTION

This invention relates generally to computer-aided design (CAD) techniques for placement of logic functions and cells on an integrated circuit chip during the chip design process. The invention is more specifically related to a method and apparatus, typically embodied in a CAD system, for selecting and aligning cells on an application specific integrated circuit (ASIC).

BACKGROUND OF THE INVENTION

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer and output devices, such as computer displays, being used to provide visual feedback of the design to the designer as it is being constructed. Specifically, the design entry operation involves generating a description of the logic design to be implemented on the circuit chip in an appropriate machine-readable form.

Chip designers generally employ hierarchical design techniques to determine the appropriate selection and interconnection of logic and/or memory devices that will enable the chip to perform the desired function. These techniques involve describing the chip's functionality at various levels of abstraction, ranging from the most general function performed by the chip to the precise functions performed by each logic and/or memory element on the chip.

The hierarchy of a logic design typically has "N" levels of functions, where N is an integer (N>=1) representing the number of hierarchical levels of functionality in the chip. The first level is typically the chip itself. Each of the lower levels of hierarchy, such as when "N" is an integer (1<=n<=N), represent the level of any particular function in the hierarchy. A function consists of a discrete logic and/or memory element, or any combination of such elements. It may be as simple as an inverter or a flip-flop, having one or only a few transistors, or as complex as a shift register, an arithmetic logic unit (ALU), or even a microprocessor.

A parent function at the (N) level of the hierarchy is defined as a plurality of (N+1) level functions, each of which is a child function. For example, a microprocessor at the (N) level might be defined as the parent of the following (N+1) level children: an ALU, a series of registers, a bus, and various other functions (each of which may or may not have a plurality of (N+2) level children, and so on). Each child function which is not also a parent function (i.e., which has no children) is referred to as a leaf function or cell. Each leaf cell in a design is connected to at least one other leaf cell, such connection being commonly referred to as a "net." The set of nets, each of which often defines a plurality of interconnected functions, is commonly referred to as a "netlist."

It is useful to distinguish between those cells provided by the chip vendor as primitive cells (i.e., leaf candidates) and the user-defined hierarchy blocks built upon them. One way is to speak of a "cell library" vs. a "design library" as two separate libraries, both of which are available to subsequent designs. Alternatively, at least initially, a design library contains a standard cell library. A cell library is a database containing detailed specifications on the characteristics of each logical component available for use in a design.

The initial cell library is usually provided by a chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a particular 2NAND component is specified as part of a given circuit design, it is given an instance name, to distinguish it from all other 2NAND gates used in the circuit. The instance name typically includes the instance names of all parent instances by concatenation when defining the instance in the context of the chip. A single name is sufficient when dealing only in the context of a single user function.

The user-defined blocks can then be used to design larger blocks of greater complexity. The user-defined blocks are typically added to the design library, which grows from the additions of new design modules as the design evolves. The top level of the design hierarchy is often a single block that defines the entire design, and the bottom layer of the hierarchy typically includes leaf cells, the cells (i.e., the logical components) that were originally provided in the cell library.

Two common methods for specifying the design are schematic capture and hardware description languages. The schematic capture method provides a sophisticated user interface that allows a logic circuit to be drawn in graphical form on a computer display. Typically, the design is drawn using symbols from the cell and design libraries.

Encoding the design in a hardware description language (HDL) is a more common design entry technique for specifying modern integrated circuits. Hardware description languages are specifically developed to aid designers in describing a circuit. These languages often contain specific functions and syntax to allow complex hardware structures to be described in a compact and efficient way. Often, the circuit is specified at the register transfer level (also known as a "behavior level"). The register transfer level description is often specified in terms of relatively small building blocks, the names of which are specified by the circuit designer.

For designs using HDL entry, the generation of a detailed description (or gate-level description) is often accomplished using logic design synthesis software. Logic design synthesis software generates a gate-level description of user-defined input and output logic, and also creates new gate-level logic to implement user-defined logical functions. Constituent parts of new gate-level logic created during each pass through the logic design synthesis software are typically given computer-generated component and net names. Each time the logic design synthesis software is executed, the component and net names that are generated by the software, and not explicitly defined by the user, may change depending on whether new logic has been added to or deleted from the integrated circuit design. Typically, the logic design synthesis software is executed many times during the integrated circuit design process, because errors are detected during the simulation and testing phases of the design cycle and then fixed in the behavioral description.

In some design processes, the output of the logic design synthesis software is optimized by a logic optimizer tool, typically implemented in software. The logic optimizer tool can often create more efficient logic in terms of space, power or timing, and may remove logic from the design that is unnecessary. This action also typically affects the component and net names generated by the logic synthesis tool.

The output of the logic optimizer tool is an optimized detailed description that completely specifies the logical and functional relationships among the components of the design. Once the design has been converted to this form, it is necessary to verify that the logic definition is correct and that the circuit implements the function expected by the designer. If errors are detected or the resulting functionality or timing is unacceptable, the designer modifies the design as needed. As a result of each revision to the design, the logic design synthesis-generated component and net names may again change. These design iterations, however, help ensure that the design satisfies the desired requirements.

After timing verification and functional simulation has been completed on the design, placement and routing of the design's components is performed. These steps involve assigning components of the design to locations on the integrated circuit chip and interconnecting the components to form nets. This may be accomplished using automated and/or manual place and route tools.

Because automatic placement tools may not yield an optimal design solution, particularly for high performance designs that have strict timing and physical requirements, circuit designers often manually place critical circuit objects (e.g., functions or cells) within the boundary of the integrated circuit. This may be accomplished by using a commercially available placement directive tool (also known as a placement or floorplanning tools), typically implemented in software. The placement tool may include a graphics terminal that provides the circuit designer with visual information pertaining to the circuit design. This information is typically contained in several different windows.

A floorplanning window may display a graphical representation of, for example, the die area of an integrated circuit, the placed objects and connectivity information. Similarly, a placed physical window may display the alphanumeric names of all placed cells and hierarchical functions. An un-placed physical window may display the alphanumeric names of all un-placed cells and hierarchical functions. A logic window may display a hierarchical tree graph of the circuit design.

During the placement process, the circuit designer may select the name of a desired object from the un-placed physical window displaying the un-placed objects. After this selection, the placement tool retrieves the physical representation of the selected object, and the circuit designer uses the cursor to position the physical representation of the selected object within the floorplanning window. The placement tool may then move the alphanumeric name of the selected object from the un-placed physical window to the placed physical window to indicate the placement thereof.

To edit the placement of desired objects, the circuit designer typically selects the desired object from within the floorplanning window using a pointing device. For example, the circuit designer may draw a rectangle around the desired objects to affect the selection. After selection, the circuit designer may instruct the placement tool to perform a desired editing function on the selected objects.

Some placement tools allow the circuit designer to select a desired level of hierarchy or region as the current working environment, or "context". When the context is set, all of the objects existing at the next lower level in the circuit design hierarchy are displayed in one of the physical windows, thus making them available for placement or editing. These objects are called children objects of the selected context, and may include other hierarchical objects, including regions and/or cells. Thus, a context may include a mixture of regions and cells.

In this environment, a circuit designer may perform preliminary placement by first placing high level regions. In some placement tools, the outer boundaries of the regions are appropriately sized to accommodate all underlying objects, even though all of the objects may not yet be placed. Thus, the circuit designer may rely on an automated placement tool to subsequently position the underlying objects within the boundary of the region. If more detailed placement is required because of timing, physical or other constraints, selected lower level regions or cells may be manually placed by the circuit designer.

After placement is complete, the routing step must be performed. As mentioned above, a net is a set of points that are to be electrically equivalent by connection. The purpose of routing is to connect points in each net of the logic design so that the connections required within nets are complete. The position of the points in any particular net are decided by the placement process, although there may be sets of points that are already connected together, thereby introducing choices as to where a connection has to be made to complete a net.

Global routing aims to decide exactly which points in each net will be connected together and the approximate path that each connection will take. Fine routing involves determining the final paths of all connections needed to complete the design. Automatic routing by routing tools often requires a large amount of computational effort. The routing problem can be significantly reduced in complexity if a near-optimal placement of the cells has been achieved. It is during this final stage of the physical design of the circuit that the inability to complete the design on a particular sized chip and architecture is detected. This layout failure may have been caused by an unsatisfactory placement. Often, the failure to complete the design is only apparent when the final few percent of the connections are being added. Hence, it is critical that an excellent placement of the cells is generated during the placement process.

In recent years, data paths have become a greater part of many modern chip designs, often consuming over 80 percent of the total circuitry on the chip. Ideally, a placed data path includes a collection of vertical and horizontal wires with logic elements located at the intersections that combine to perform an overall data processing function. While some placement tools attempt to automate part of all of the placement of data path structures, circuit designers can often provide a better solution by manually placing at least some of the cells.

To manually place cells within a data path, it is often desirable to traverse the data path to evaluate the placement of the placed cells and to identify unplaced cells that are part of the data path. To date, traversing such data path structures has been difficult. To identify cells within the data path, the circuit designer typically must manually find each instance name by scanning some external printout, panning through a list of instance names in the placed physical window, or by identifying the physical representation of the cell within the floorplanning window. Each of these has proven to be time consuming and tedious, particularly since many logic design synthesis software programs assign computer generated component and net names.

As a result of these difficulties, circuit designers often only have time to manually place a fraction of the cells within a data path. The remaining cells are placed using automatic placement tools, which typically use algorithms that optimize wire congestion rather than performance or gate density. Accordingly, any improvement in the manual placement process that can significantly reduce the time required to traverse and place cells within a circuit design would be beneficial.

SUMMARY OF THE INVENTION

The present invention provides methods and apparatus for efficiently traversing and placing cells in a circuit design. In one illustrative embodiment, one or more leaf cells are identified as base objects. The base objects are placed and aligned along a selected dominate axis, if not already placed and aligned. Once the base objects are identified, an input port can be identified by the circuit designer. In many cases, selected base objects will have at least one common input port identifier, such as "A". By having a common input port identifier, the corresponding input port for each of the selected base objects can be identified. Once identified, the source leaf cells that have an output port that is coupled to the identified input ports can be identified.

As can readily be seen, this may provide an efficient way for a circuit designer to traverse through the various leaf cells and connections of a circuit design. This may be particularly beneficial when analyzing a data path within a circuit design. When the base objects are part of a data path, the identified source leaf cells that drive the identified input ports of the selected base objects are often part of the previous stage of the data path. Thus, a circuit designer can easily trace back through the data path to evaluate the placement of the various cells of the data path. To help place the various cells of a data path, it is contemplated that the identified source leaf cells may be placed and aligned along the dominate axis of the base objects, if desired.

At any time, a different input port name may be selected, identifying a different input port of selected base objects. The tool may then identify the source leaf cells that have an output port that is connected to the identified input ports. Again, the newly identified source leaf cells may be aligned along the dominate axis of the base objects, if desired. This process may continue until all of the leaf cells driving the input ports of the base objects have been identified and/or aligned.

It is contemplated that the source leaf cells that are identified as having an output port connected to a selected input port of selected base objects may be identified as the new base objects. Once selected, the above-described process may be repeated to identify those source leaf cells that drive a selected input port of the new base objects. If desired, the identified leaf cells may be aligned along the dominate axis of the new base objects, as described above. This process may continue until, for example, an entire data path is placed and aligned.

Rather than selecting an input port of selected base objects, it is contemplated that an output port name may be selected. In this case, those destination leaf cells that have an input port that is connected to the selected output ports may be identified and, if desired, aligned along the dominate axis of the base objects. It is contemplated that there may be a qualifier or filter to identify only those destination leaf cells that are, for example, placed. If unplaced destination leaf cells are identified, the present invention preferably places the leaf cells. In some cases, more than one destination leaf cell will be identified for selected base objects. If this occurs, a selected destination leaf cell is selected for each base object. The selected destination leaf cells are then aligned along the dominate axis of the base objects, if desired. The remaining destination leaf cells may be placed adjacent the corresponding selected destination leaf cell and aligned along an axis that is perpendicular to the dominate axis.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 6A is a diagram showing illustrative information displayed in the second physical window 290 in the data path mode;

FIG. 6B is a diagram showing illustrative information displayed in the first physical window 292 in the data path mode;

DETAILED DESCRIPTION OF THE PREFERRED EMBODIMENTS

Figure 1:
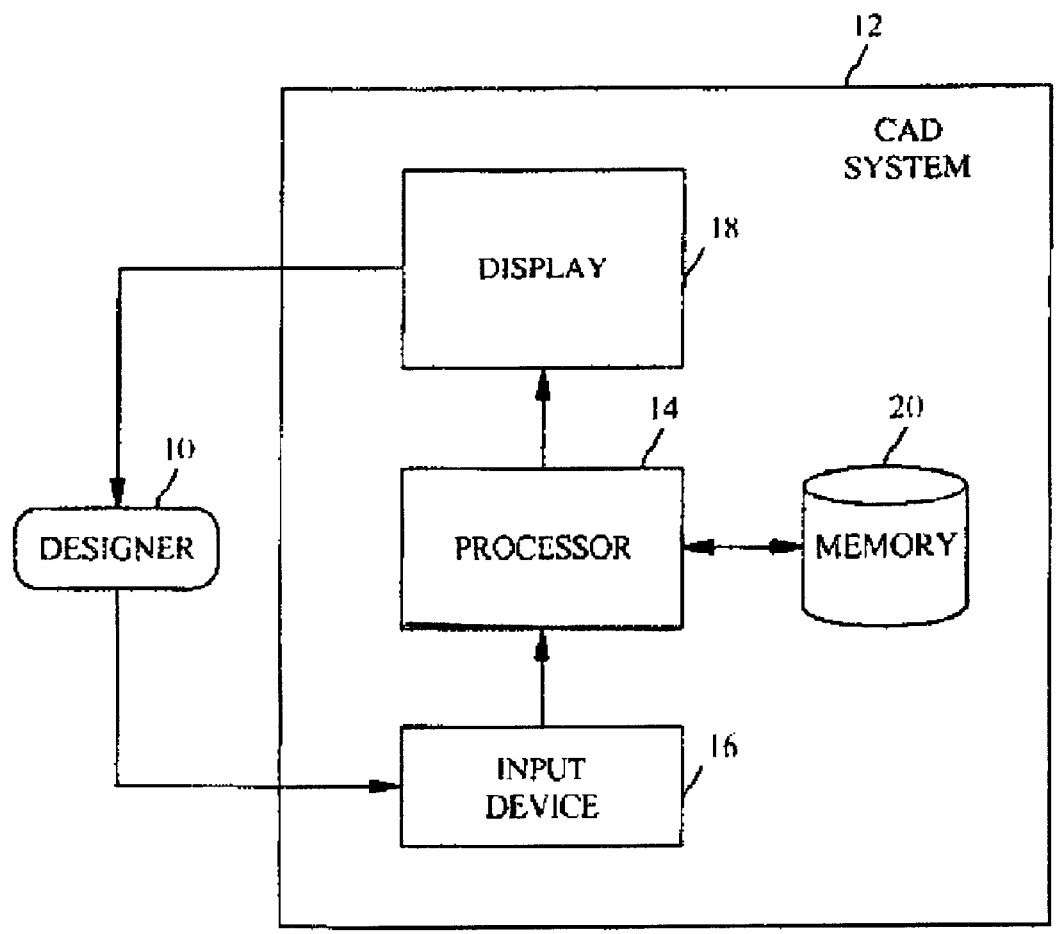
FIG. 1 is a block diagram of the computer-based environment of the present invention.

The detailed description which follows is presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding and comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to an apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus to perform the required method steps. The required structure for such machines will be apparent from the description given below.

In sum, the present invention preferably is implemented for practice by a computer code expression executing on a computer. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with a CAD System 12 to enter a circuit design, validate the design, place the design's components on a chip, and route the interconnections among the components. The CAD System 12 includes a Processor 14, which executes operating system software as well as application programs known as CAD software. The Processor is found in all general purpose computers and almost all special purpose computers. The CAD System 12 is intended to be representative of a category of data processors suitable for supporting CAD operations. In one illustrative embodiment, the CAD System is a HP A1097C Series 700 engineering workstation, commercially available from Hewlett-Packard Corporation, although other engineering workstations or computer systems from manufacturers such as Sun Microsystems, Inc., may also be used.

The Designer 10 enters design information into the CAD System by using a well-known Input Device 16 such as a mouse, a keyboard, or a combination of the two devices. It should be understood, however, that the Input Device may actually be a card reader, magnetic or paper tape reader, or other well-known input device (including another computer system). A mouse or other cursor control device is typically used as an Input Device as a convenient means to input information to the CAD System to select command modes, edit input data, and the like.

Visual feedback of the design process is given to the Designer by showing the design being constructed as graphical symbols on Display 18. The Display is used to display messages and symbols to the Designer. Such a Display 18 may take the form of any of several well-known varieties of CRT displays. The CAD software being executed by the Processor 14 stores information relating to the logic design in Memory 20. The Memory may take the form of a semiconductor memory, magnetic disks, optical disks, magnetic tape or other mass storage device.

Figure 2:
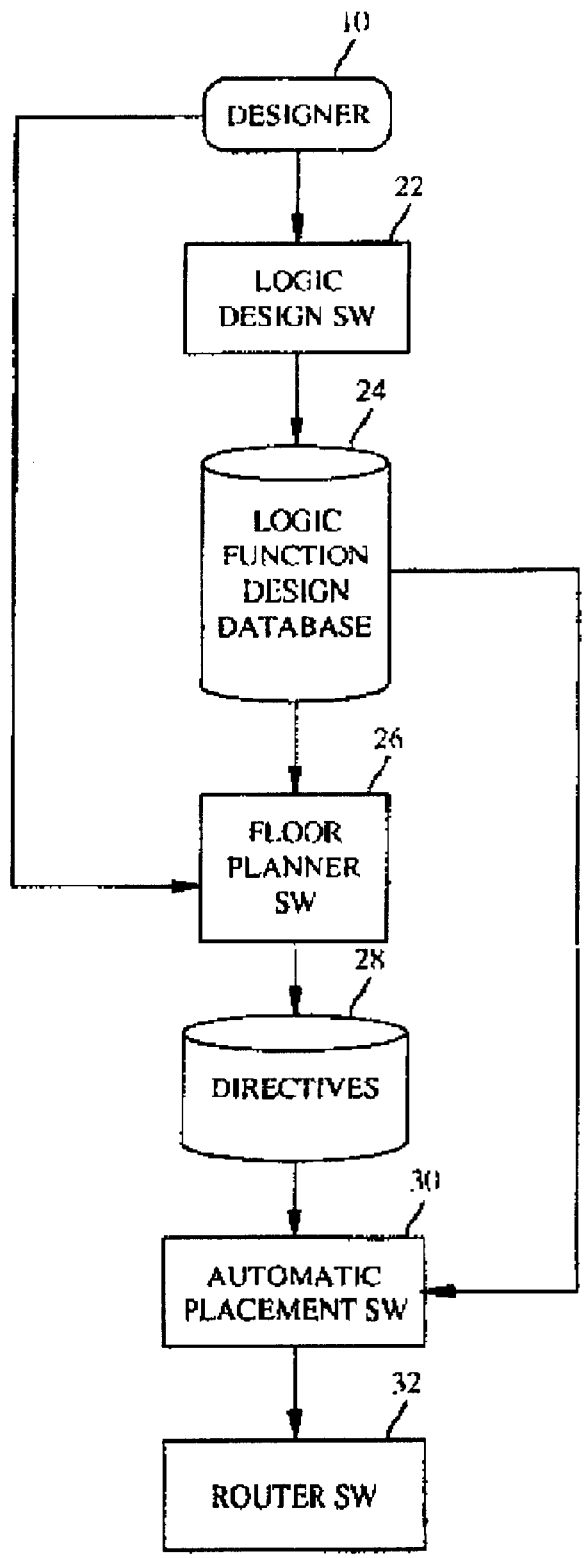
FIG. 2 is a block diagram of an illustrative process environment of the present invention.

FIG. 2 is a block diagram of an illustrative process environment of the present invention. The Designer 10 initially specifies a logic design of an integrated circuit using the graphical user interface (GUI) capabilities of the Logic Design Software (SW) 22 (i.e., when using the schematic method) or inputs a data file containing Hardware Description Language (HDL) text to the Logic Design SW (when using the HDL method). The output of the Logic Design SW 22 is a Logic Function Design Database 24. This database holds the design information, captured by the Logic Design SW 22, describing the logic functions of the circuit being designed by the Designer 10. This database is stored in the Memory 20 of the CAD System 12.

The Logic Function Design Database 24 is input to the Floor Planner SW 26. The Floor Planner SW 26 is a manual placement computer program used to place the logic function blocks and cells onto the integrated circuit chip. The Designer 10 interacts with the Floor Planner SW 26 to direct the placement of the logic blocks and cells. The output of the Floor Planner SW 26 is a set of Directives 28. Directives consist of commands and associated information to direct the Automatic Placement SW 30 to complete the placement of all logic functions and cells that are yet to be placed after the Designer has finished manually placing logic functions and cells. Directives 28 are also stored in the Memory 20 of the CAD System 12. Automatic Placement SW also takes the Logic Function Design Database as an input parameter. The Automatic Placement SW 30 then forwards the completed placement to the Router SW 32 for determination of the routing for the chip.

In the preferred embodiment, the present invention exists as improvements to Floor Planning SW 26 provide the Designer 10 with the capability to efficiently select, place and align selected cells when desired. This may be particularly beneficial when working with a data path of a circuit design.

Figure 3:
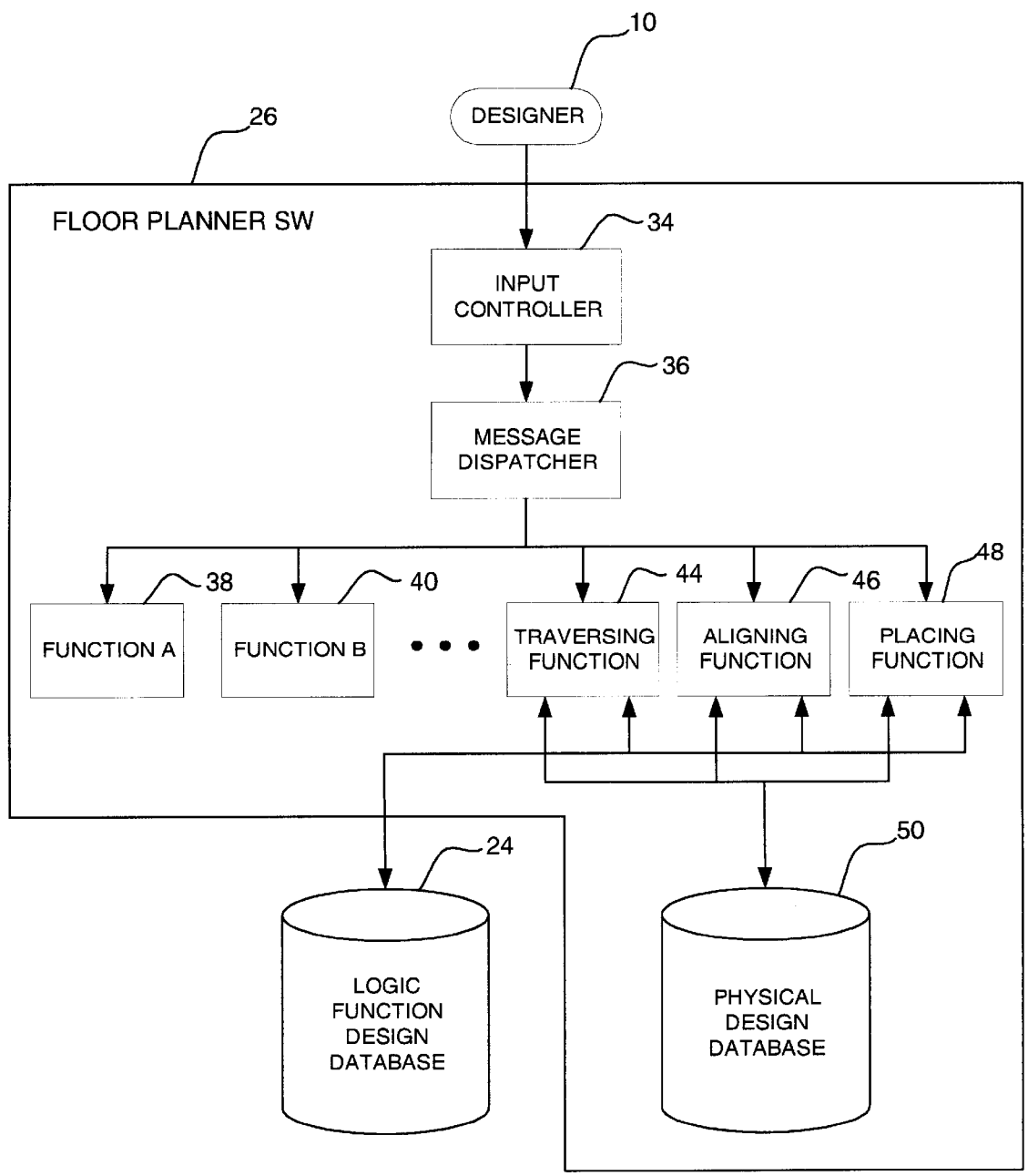
FIG. 3 is a block diagram of the Floor Planner software containing the preferred embodiment of the present invention.

FIG. 3 is a block diagram of the Floor Planner software containing an illustrative embodiment of the present invention. The Designer 10 interacts with the Floor Planner SW 26 to place logic functions specified in the Logic Function Design Database 24 onto an ASIC chip. The Designer uses an input device such as a mouse to make selections from menus containing requests for particular functions to be executed. The Designer may also select portions of the logic function hierarchy to be placed and locations on the ASIC chip where the selected logic functions are to be placed.

The Input Controller 34 handles all input requests from the Designer. Input requests are translated into messages requesting the execution of functions supported by the Floor Planner SW. These messages are forwarded by the Message Dispatcher 36 to various Floor Planner SW functions as required. Sample Floor Planner SW functions are represented on FIG. 3 as Function A 38, Function B 40, etc. When a function receives a message, it is activated to implement the request contained in the message. This implementation sometimes involves an update to the representation of placement processing shown on the Display 18 (not shown in FIG. 3).

Some of the many functions supported by the Floor Planner SW may include a traversing function 44, an aligning function 46 and a placing function 48. These functions may read from the Logic Function Design Database 24 to identify certain logical connections between cells, and may also read and write the Physical Design Database 50. The Physical Design Database 50 is a data structure holding all placed and unplaced logic functions that are specified by the Logic Function Design Database 24, as well as the interconnections of the same. It is contemplated that the Logic Function Design Database 24 and the Physical Design Database 50 may be incorporated in the same database.

The traversing function 44 may allow the Designer 10 to efficiently traverse through the cells within a circuit design. Preferably, the circuit designer 10 identifies one or more leaf cells as base objects. This may be accomplished in any number of ways including, for example, using the selection methods described in co-pending U.S. patent application Ser. No. 09/597,529, filed Jun. 20, 2000, and entitled "Method And Apparatus For Selecting And Aligning Cells In A Placement Tool", which is incorporated herein by reference.

Once base objects are identified, the aligning function 46 may align the base objects along a selected dominate axis, if desired. The circuit designer 10 then may identify an input port of one of the base objects. When an input port is selected, the corresponding input ports for each of the selected base objects can be identified. If the selected input port is unique among the base objects, only one input port will be identified.

Once the input port or ports of the base objects are identified, the traversing function 44 may identify the source leaf cells that have an output port coupled to the identified input ports. Preferably, this is accomplished by first identifying the net connected to each of the identified input ports, and then scanning the logical database to identify those source leaf cells that have an output port connected to the identified nets.

It is contemplated that at any time, the circuit designer 10 may select a different input port, which identifies a different input port of selected base objects. The traversing function 44 may then identify the source leaf cells that have an output port that is connected to the newly identified input ports of the base objects. The placing function 48 may then be used to place the newly identified source leaf cells, and the aligning function may be used to align the newly identified source leaf cells along the dominate axis of the base objects, if desired. The placing function 48 and the aligning function 46 may be implemented together so that when the newly identified leaf cells are placed, they are automatically aligned. This process may continue until, for example, all of the leaf cells that drive the input ports of the base objects are identified, placed and/or aligned.

It is contemplated that the circuit designer 10 may identify as new base objects some or all of the source leaf cells that have an output port connected to a selected input port of the current base objects. If one or more new base objects are identified, the above-described process may be repeated to identify the source leaf cells that drive a selected input port of the new base objects. The placing function 48 may then be used to place the identified leaf cells, and the aligning function 46 may be used to align the identified leaf cells along the dominate axis of the new base objects, if desired. This process may continue until, for example, an entire data path is placed and aligned.

To help traverse a hierarchical database, a data path tree may be maintained to identify the current and previous base object sets. The data path tree can be used to traverse up the hierarchical tree of the database. This may be useful when, for example, one leg of a hierarchical database is successfully placed and aligned as described above. Using the data path tree, the circuit designer may then easy traverse back up the hierarchy of the database, and select a different leg for placement.

As can be seen, the above described methods may provide a circuit designer 10 with an efficient way to traverse, place and/or align various leaf cells of a circuit design. This may be particularly beneficial when analyzing a data path structure. When, for example, the base objects are part of a data path, the identified source leaf cells that drive the identified input ports of the selected base objects may be part of a previous stage of the data path. Accordingly, using the above-described methods, a circuit designer can easily traverse back and forth through the data path to evaluate the placement of the various cells of the data path, and if desired, place and align the leaf cells of the data path.

Rather than identifying an input port of selected base objects, it is contemplated that the circuit designer 10 may identify an output port. In this case, the traversing function 44 may identify those destination leaf cells that have an input port that is connected to the identified output ports. The placing function 48 may then be used to place the identified destination leaf cells, and the aligning function 48 may be used to align the identified destination leaf cells along the dominate axis of the base objects, if desired.

It is contemplated that the traversing function 44 may include a qualifier or filter for identifying only those destination leaf cells that are, for example, placed. However, if both placed and unplaced destination leaf cells are identified by the circuit designer 10, the placing function 48 may be used to place the unplaced leaf cells, as described above.

In some cases, more than one destination leaf cell will be identified as being connected to the identified output port of selected base objects. If this occurs, a selected destination leaf cell is preferably selected for each base object. The aligning function 46 then aligns the selected destination leaf cells along the dominate axis of the base objects. Then, the aligning function 46 aligns the remaining destination leaf cells adjacent the corresponding selected destination leaf cell, along an axis that is substantially perpendicular to the dominate axis of the base objects. This provides an efficient method for automatically placing multiple destination leaf cells in a pseudo array configuration.

Figure 4:
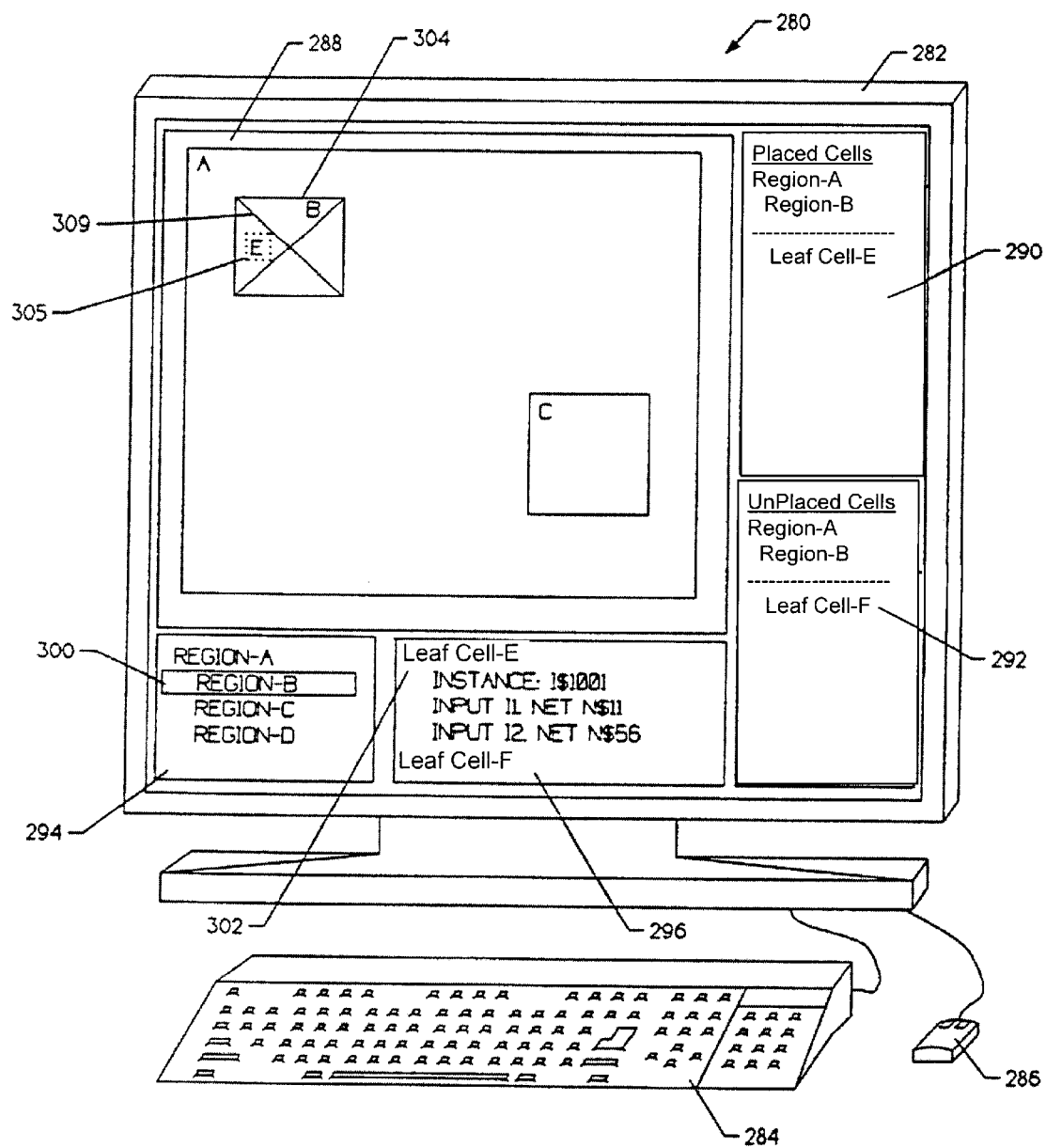
FIG. 4 is a block diagram of a data processing system executing an illustrative placement tool in accordance with the present invention.

FIG. 4 is a block diagram of a data processing system executing an illustrative placement tool in accordance with the present invention. The data processing system 280 include a display device 282, a keyboard 284 and a pointing device 286. A microprocessor or the like may be included in the display device 282 or in a separate unit (not shown). The data processing system 280 preferably incorporates a placement tool. The placement tool may be implemented in either hardware or software. In a preferred embodiment, the placement tool is implemented in software that executes on the data processing system 280.

The illustrative placement tool displays a number of windows on the display device 282. These windows including a floorplanning window 288, two logical windows 294 and 296, and two physical windows 290 and 292. The floorplanning window displays a physical representation of the circuit design database, and in particular, displays those cells and/or logic functions that are placed on a scaled representation of an integrated circuit die.

The first logical window 294 displays a tree graph of the circuit design hierarchy. During use, the circuit designer may scroll through the first logical window 294 to identify particular logic functions (a.k.a. regions) therefrom. In the illustrative diagram, region-B has been identified, as shown at 300. In a preferred embodiment, only logic functions are displayed in the first logical window 294. Leaf cells are not displayed.

The second logical window 296 displays the leaf cells within the logic function that is identified in the first logical window 294. For example, if region-B is identified in the first logic window 294 as shown at 300, the second logical window 296 displays the leaf cells within region-B. In the example shown, the second logical window 296 displays leaf cell-E and leaf cell-F, as shown at 302.

It is contemplated that the second logical window 296 may also display selected database objects for each of the leaf cells displayed therein. For example, the second logical window 296 may display the instance name, the input pin names along with the associated net names for each input pin, the output pin names along with the associated net names for each output pin name, etc. It is contemplated that any number of predefined database objects may be displayed for each of the leaf cells within the second logical window 296.

Preferably, the placement tool may allow the circuit designer to set a current context. In general, after any logic function is selected or identified, the circuit designer may set the current context to the selected logic function by hitting a predefined set context key. A further discussing of setting a current context can be found in U.S. patent application Ser. No. 08/789,026, filed Jan. 27, 1997, and entitled "Method and Apparatus for Selecting Components within a Circuit Design Database", which is incorporated herein by reference.

The first physical window 292 displays all unplaced cells within the current context. Similarly, the second physical window 290 displays all placed cells within the current context. In a preferred embodiment, the current name of the logic function or cell that is set as the current context is displayed in the title bar of each of the first and second physical windows. In the illustrative embodiment, region-B is set as the current context, and thus the title bar above the first and second physical windows displays the name "region-B", as shown.

The floorplanning window 288 displays a number of placed cells. In the present example, region-A, region-B, region-C, and leaf cell-E are displayed. As indicated above, region-B is selected as the current context. Thus, the second logical window 296 displays the cells therein, including leaf cell-E 302 and leaf cell-F (partially shown), and selected database objects therefor. Leaf cell-E 306 is displayed in the second physical window 290, as shown, because leaf cell-E is already placed as shown at 305. Leaf cell-F, on the other hand, is displayed in the first physical window 292, because leaf cell-F remains unplaced.

During placement of a circuit design database, the circuit designer typically scrolls through the first physical window 292 and selects an unplaced region or cell from the first physical window 292. The placement tool may then load a physical representation of the selected region or cell, and the circuit designer may place the physical representation of the region or cell in the floorplanning window 288. The placement tool then moves the region or cell from the first physical window 292 to the second physical window 290. The first and second logic windows 294 and 296 are updated when the selection is changed in either the floorplanning window 288, the first physical window 292 or the second physical window 290.

It is recognized that the circuit design database may be much more complex and contain many more levels of hierarchy than that shown in the simple example of FIG. 4. In a typical circuit design database, large contexts often contain thousands of regions and/or cells, and thus the first and second physical windows typically display many more objects.

As indicated above, data paths have become a greater part of many modem chip designs, often consuming over 80 percent of the total circuitry on the chip. Ideally, a placed data path includes a collection of vertical and horizontal wires with logic elements located at the intersections that combine to perform an overall data processing function. To manually place cells within a data path, it is often desirable to select those cells that are connected to a net or group of nets. For example, it is often desirable to select those cells that are connected to a vectored net, such as a vectored net that crosses the interface of a particular logic function (e.g., ALU) within the circuit design. The vectored net may correspond to the output or an intermediate net within the data path. Once selected, it would be desirable to align the cells that are connected to the net to form an optimum data path stage.

To date, selecting cells that are connected to a net or group of nets has been difficult. For example, to select cells that are connected to a particular net, the circuit designer must typically manually find each instance name by scanning some external printout, panning through a list of instance names or net names in the logical or physical windows, or by identifying the physical representation of the cell in the floorplanning window. All of these have proven to be time consuming and tedious, particularly since many logic design synthesis software programs assign computer generated component and net names. Accordingly, circuit designers often only have time to manually place a fraction of the cells within a data path. The remaining cells are typically placed using automatic placement tools, which often use algorithms that optimize wire congestion rather than performance or gate density.

To help overcome these difficulties, U.S. patent application Ser. No. 09/597,529, filed Jun. 20, 2000, entitled "Method And Apparatus For Selecting And Aligning Cells In A Placement Tool" provides a number of methods for efficiently identifying, selecting and aligning cells that are associated with a net or group of nets within a circuit design. In one illustrative embodiment, a particular net or group of nets is first selected. Then, selected leaf cells that are connected to the selected net or group of nets are automatically identified and selected. This is preferably accomplished by using the "select sources", "select sources in context", "select unplaced sources in context", "select placed sources in context", "select cells in context", "select unplaced cells in context" and "select placed cells in context" menu options of menu 320. These menu options preferably cause the placement tool to scan the netlist of the circuit design database, and identify those cells that are connected to the selected net or group of nets and meet the stated conditions.

Once selected, the selected leaf cells are preferably made part of the current base of a data path, preferably using menu 326. Menu 326 includes a number of functions to assist in the creation of a data path base. For example, and referring to menu 326, the first menu option "Clear Base" clears the current data path base. The second menu option "Add selection to Base" adds the currently selected cells to the data path base. The third menu option "Remove Selection from Base" removes the selected cells from the data path base. Finally, the fourth menu option "Replace Base with Selection" replaces the current base cells with the selected cells. Other functions for adding and/or subtracting cells from the current data path base are also contemplated. Once the selected cells are set as the current data path base, the cells may be aligned in a direction of a predetermined alignment axis. This may be occur either automatically, or using one of the alignment or abutment menu options shown in menu 322.

This method allows a circuit designer to easily identify, select and align specific cells that are connected to a selected net or group of nets within the circuit design. This can be particularly useful when manually placing data paths within a circuit design to improve the performance and gate density of the placement solution.

Once the current base objects are placed and aligned along a predetermined dominate axis, the circuit designer may identify an input port. In many cases, several or all of the base objects will have an input port with the same input port identifier. If so, the corresponding input ports for each of the selected base objects are identified. If the selected input port identifier is unique among the base objects, only one input port will be identified. In one embodiment, each object has a port definition table, which associates a port identifier with each port. A first port of each object may then be identified by selecting a particular port identifier. In a preferred embodiment, the first port of each cell is used as a first group, then the second port, as so on.

When in the data path mode, the information displayed in the first physical window 292 and the second physical window 290 may change relative to the floorplanning mode. FIG. 6A is a diagram showing illustrative information displayed in the second physical window 290, and FIG. 6B is a diagram showing illustrative information displayed in the first physical window 292. The information displayed in FIGS. 6A–6B is for a NAND4_A block, which has inputs A1(32:0), A2(32:0), BI(31:0), B2(23:0), C(14:0) and D(14:0). The output of the NAND4_A block is coupled to the input of a flip-flop block FF_O.

The current data path object is shown in the title bar of the second physical window 290. The inputs of the NAND4_A block are displayed in section 350 of the second physical window 290. The bracketed information provided after the input name indicates the number of source leaf cells that are placed and unplaced. For example, with respect to input A1 of NAND4_A, thirty-three source leaf cells are placed [p33], and zero are unplaced [u0]. With respect to input A2, none of the source leaf cells are placed [p0], and all are unplaced [u33].

The data path base may be easily moved to the source leaf cells that drive a particular input of NAND4_A by selecting a corresponding input in section 352. That is, to set the data path base to the leaf cells that drive the thirty-three bits of A1, the user may simply select input A1[p33u0n0:Z230EZ@2147<-Z231BZ@2147] in section 352. If some of these cells are unplaced, the tool may automatically place the unplaced cells. Once a data path base is selected, cells may be included or excluded from the base using any of the selection options of menu 326 of FIG. 5.

When the data path base is changed, a new entry is placed in section 356. Section 356 maintains a data path tree, which enables the circuit designer to easily traverse forward or backward through the data path tree, and control the inputs displayed in the second physical window 290.

In the data path mode, the first physical window 292 preferably identifies whether the source leaf cells for each of the inputs of the selected base are placed or unplaced. Those inputs that have unplaced source leaf cells are identified in section 360, and those inputs that have source leaf cells that are all placed are identified in section 362. In section 360, inputs A2 and D are identified. All thirty-three of the source leaf cells for input A2 are unplaced, while only three of the source leaf cells for input D are unplaced.

In one illustrative embodiment, when the user selects one of the inputs from section 360, the unplaced driving cells are placed, and the input is moved to section 362. This provides an easy way to place those cells that are coupled to the inputs of a selected block, such as NAND4_A. In one embodiment, the selection of an input from the unplaced section 360 or the placed section 362 sets the current data path base to the set of source cells that drive the selected input. Like section 256 of the second physical window 290, section 364 displays a data path tree that enables the circuit designer to easily traverse through the data path tree.

Another way to select source leaf cells is to use menu 320 of FIG. 4, as further described in co-pending U.S. patent application Ser. No. 09/597,529, filed Jun. 20, 2000, entitled "Method And Apparatus For Selecting And Aligning Cells In A Placement Tool". That is, once selected input ports of the base objects are identified, the placement tool may identify selected source leaf cells that are coupled to the identified input ports. The placement tool may accomplished this by, for example, first identifying the net names of each of the identified input ports, and scanning the logical database to identify those source leaf cells that have an output port that is connected to the identified nets.

Once the source leaf cells are identified, they are preferably automatically placed and aligned to the base. For placed cells, it is contemplated that the "align to datapath base" menu option of menu 322, or some other alignment or abutment command, may be used. This may cause the placed identified source leaf cells to be aligned along the dominate axis of the current base objects. The circuit designer may then select a different input port name, which may identify a different input port of selected base objects. Then, using the "align to datapath base" menu option of menu 322, or some other alignment or abutment command, the newly identified placed source leaf cells may be aligned along the dominate axis of the current base objects. Unplaced cells are preferably automatically placed and aligned along the dominate axis of the current base objects. This process may continue until, for example, all of the leaf cells that drive one or more of the: input ports of the base objects are identified, placed and aligned.

Figure 5:
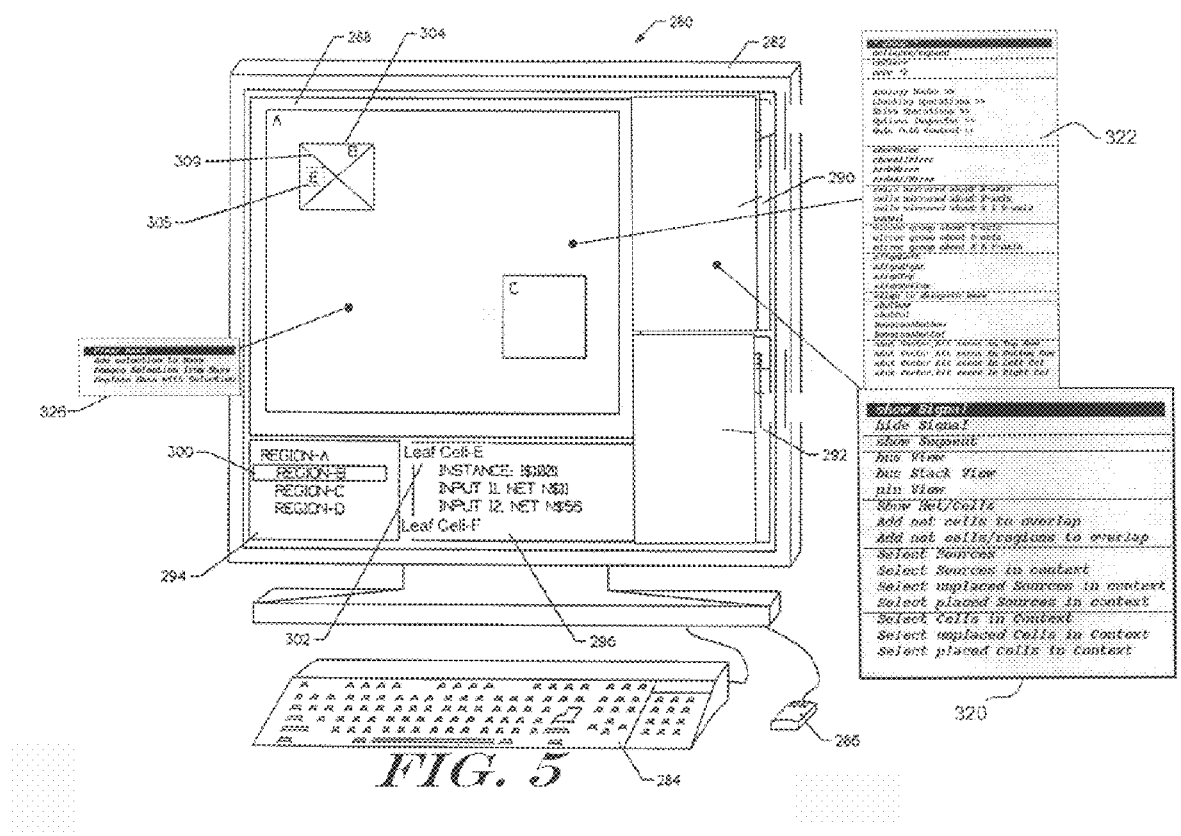
FIG. 5 is a block diagram of the illustrative placement tool of FIG. 4 with the second physical window in an interface mode in accordance with the present invention.

At any time, the circuit designer may identify the identified source leaf cells as the new base objects, preferably using menu 326 of FIG. 5 as further described above. If one or more new base objects are identified, the above-described process may be repeated to identify the source leaf cells that drive a selected input port of the new base objects. Then, using the "align to datapath base" menu option of menu 322, the identified placed source leaf cells may be aligned along the dominate axis of the current base objects. Unplaced cells are preferably automatically placed and aligned along the dominate axis of the current base objects. This process may continue until, for example, all of the leaf cells that drive one or more of the input ports of the base objects are identified, placed and aligned.

As can be seen, the above described process may provide a circuit designer with an efficient way to traverse, place and/or align various leaf cells of a circuit design. This may be particularly useful when analyzing or placing a data path structure. When, for example, the base objects are part of a data path, the identified source leaf cells that drive the identified input ports of the base objects may be part of a previous stage of the data path. Accordingly, using the above-described methods, a circuit designer may easily traverse back through the data path to evaluate the placement of the various cells of the data path, and if desired, place and align the leaf cells of the data path.

Rather than identifying an input port name of selected base objects, it is contemplated that the circuit designer may identify an output port name. In this case, those destination leaf cells that have an input port that is connected to the identified output ports may be identified. Then, using the "align to datapath base" menu option of menu 322, the newly identified placed source leaf cells may be aligned along the dominate axis of the current base objects. Unplaced cells are preferably automatically placed and aligned along the dominate axis of the current base objects.

In some cases, more than one destination leaf cell may be identified as being connected to the identified output port of selected base objects. If this occurs, a selected destination leaf cell is preferably selected for each base object. If the selected destination leaf cell is placed, the "align to datapath base" menu option may then be used to aligned it along the dominate axis of the current base objects. If the selected destination leaf cell is unplaced, the tool preferably automatically places and aligns the cell along the dominate axis of the current base objects.

The remaining destination leaf cells may be aligned adjacent the corresponding selected destination leaf cell, along an axis that is substantially perpendicular to the dominate axis of the base objects. This provides an efficient method for automatically placing multiple destination leaf cells in a pseudo array configuration.

Figure 7:
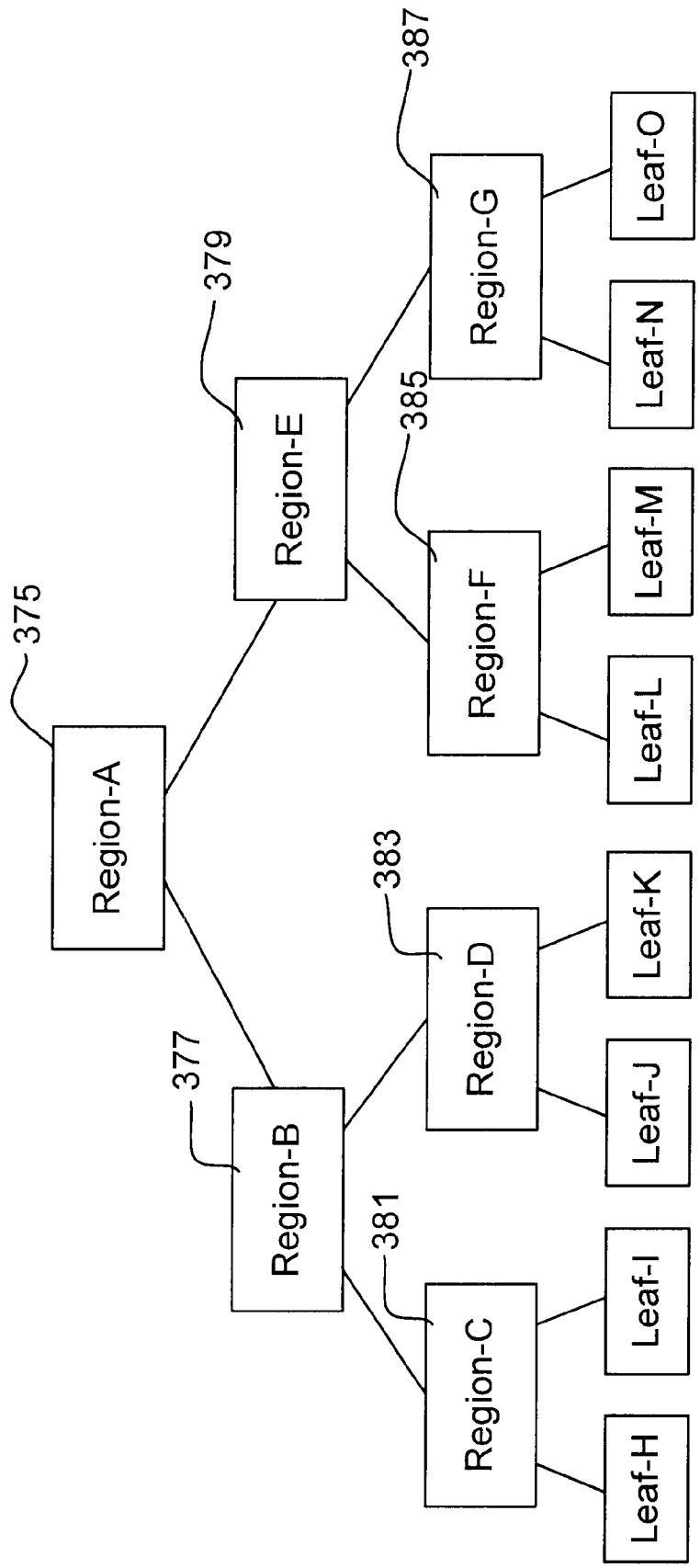
FIG. 7 is a schematic diagram of a hierarchical data base, which illustrates how the data path tree sections 356 and 364 of the first and second physical windows of FIGS. 6A–6B can be used traverse a hierarchical circuit design database.

FIG. 7 is a schematic diagram of a hierarchical data base, which illustrates how the data path tree sections 356 and 364 of the first and second physical windows of FIGS. 6A–6B can be used traverse a hierarchical circuit design database. A top level region labeled Region-A is shown at 375. Region-A 375 has two second level regions including Region-B 377 and Region-E 379. Region-B 377 has two third level regions including Region-C 381 and Region-D 383. Likewise, Region-E 379 has two third level regions including Region-F 385 and Region-G 387. Finally, Region-C 381, Region-D 383, Region-F 385 and Region-G 387 each have two leaf cells.

In one example, it may be convenient to first place and align the cells under the Region-B 377 tree of the hierarchical circuit design. To do so, the circuit designer may first move the current data path base from Region-A 375 to Region-B 377, and then to Region-C 381. Once the current data path base is set to Region-C 381, the data path tree sections 356 and 364 of the first and second physical windows of FIGS. 6A–6B preferably show the previous data path bases including Region-A 375 and Region-B 377. By picking one of the previous data path bases from the data path tree sections 356 or 364, the circuit designer may quickly return to any appropriate level within the circuit design database. For example, the circuit designer may pick Region-B from the data path tree sections 356 or 364, and proceed down the Region-D 383 leg. Then, the circuit designer may pick Region-A from the data path tree sections 356 or 364, and proceed down the Region-E 379 leg. This allows the circuit designer to easily traverse through the circuit design to place the various cells as desired.

Figure 8:
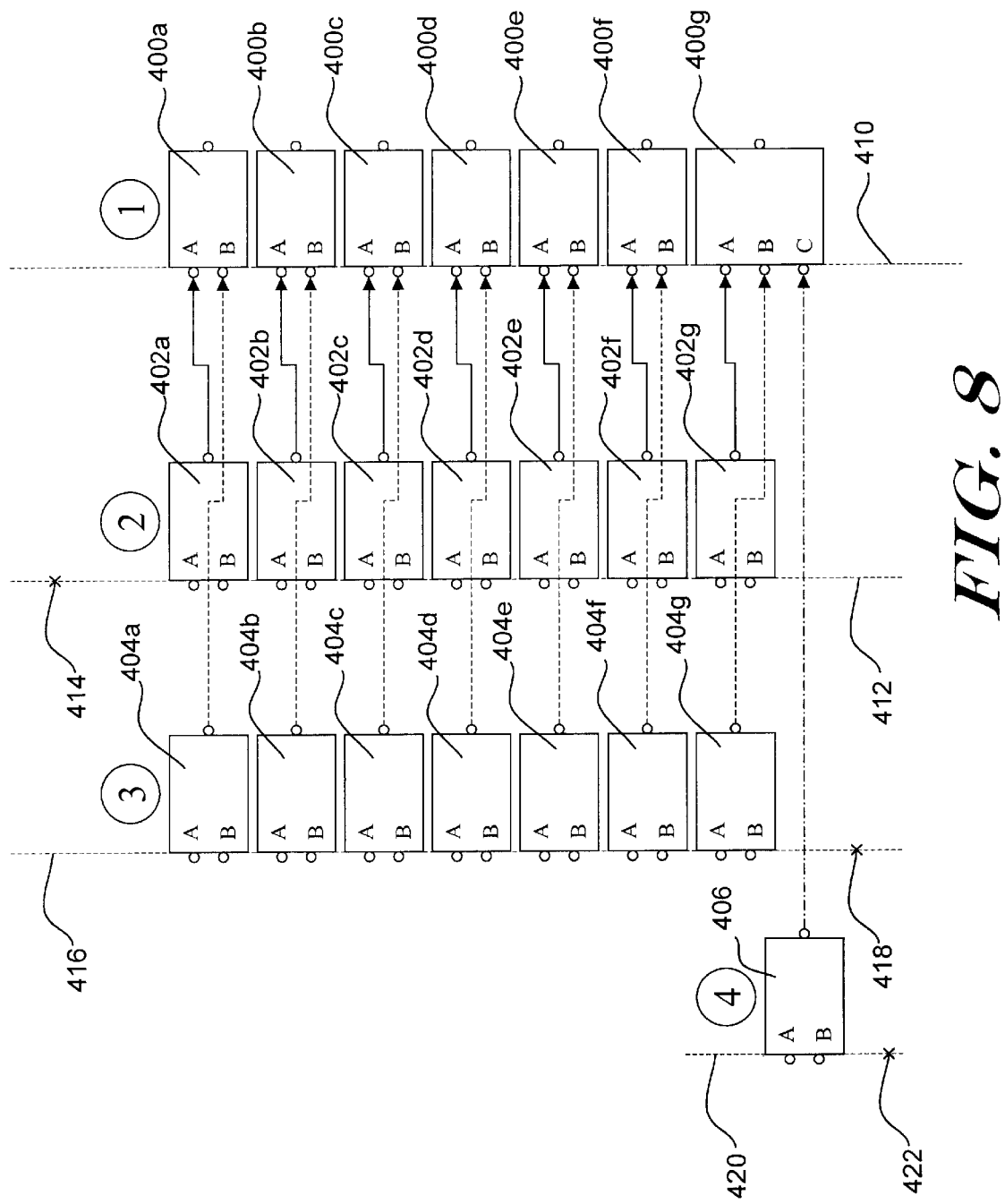
FIG. 8 is a schematic diagram showing an illustrative method for analyzing, placing and/or aligning cells of a data path in accordance with the present invention.

FIG. 8 is a schematic diagram showing an illustrative method for analyzing, placing and/or aligning cells of a data path in accordance with the present invention. In accordance with the illustrative method, a circuit designer preferably selects a cell or group of cells, such as cells 400a–400g. This is preferably accomplished using either conventional methods or the methods disclosed in U.S. patent application Ser. No. 09/597,529, filed Jun. 20, 2000, entitled "Method And Apparatus For Selecting And Aligning Cells In A Placement Tool". Once selected, the group of cells 400a–400g are identified as base objects using the data path control menu 326 of FIG. 5, setting the data path view in physical windows 292 and 290, and selecting the data path based on the input port group. Then, the base objects are either automatically aligned in the direction of a dominate axis, such as dominate axis 410, or aligned or abutted using menu 322 of FIG. 5.

Once the base objects 400a–400g are aligned along the predetermined dominate axis 410, the circuit designer may identify an input port identifier. In the illustrative embodiment, the circuit designer first selects an input port identifier to identify input port "A". This selects the corresponding input port, such as input port "A", for each of the base objects 400a–400g. Once selected, the source leaf cells that have an output port coupled to the identified input ports are identified. The placement tool preferably identifies the source leaf cells by first identifying the net names of each of the identified input ports, and then scanning the logical database to identify those source leaf cells that have an output port that is connected to the identified nets. In the embodiment shown, this identifies cells 402a–402g.

Once the source leaf cells 402a–402g are identified, the "align to datapath base" menu option may be used to align the placed leaf cells 402a–402g along an axis 412 that is parallel to the dominate axis 410 of the current base objects 400a–400g. The position of axis 412 is preferably identified by a mouse click, such as mouse click 414. For those leaf cells 402a–402g that are unplaced, the tool preferably automatically aligns the cells along axis 412.

The circuit designer may then select a different input port identifier, such as an identifier for input port "B". This selects the corresponding input port, such as input port "B", for each of the base objects 400a–400g. Once selected, the source leaf cells that have an output port coupled to the identified input ports are identified. Preferably, the placement tool identifies the source leaf cells by first identifying the net names of each of the identified input ports, and then scanning the logical database to identify those source leaf cells that have an output port that is connected to the identified nets. In the embodiment shown, this identifies cells 404a–404g. Then, for those source leaf cells 404a–404g that are placed, the "align to datapath base" menu option of menu 322 of FIG. 5 can be used to aligned them along an axis 416 that is parallel to the dominate axis 410 of the current base objects 400a–400g. Like axis 414, the position of axis 416 is preferably identified by a mouse click, such as mouse click 418. For those leaf cells 404a–404g that are unplaced, the tool preferably automatically aligns the cells along axis 412.

The circuit designer may then select a different input port identifier, such as an identifier corresponding to input port "C". This selects the corresponding input port, such as input port "C", for each of the base objects 400a–400g. Once selected, the source leaf cells that have an output port coupled to the identified input ports are identified. In the embodiment shown, this only identifies cell 406, since none of the other base objects 400a–400f have an input port that corresponds to an input port "C". Then, if source leaf cell 406 is already placed, the "align to datapath base" menu option of menu 322 of FIG. 5 may be used to aligned it along an axis 420 that is parallel to the dominate axis 410 of the current base objects 400a–400g. Like axis 414, the position of axis 420 is preferably identified by a mouse click, such as mouse click 422. If source leaf cell 406 is unplaced, the tool preferably automatically aligns the cell along axis 412. This process may continue until, for example, all of the leaf cells that drive one or more of the input ports of the base objects 400a–400g are identified, placed and aligned.

At any time, it is contemplated that the circuit designer may identify the source leaf cells as the new base objects. For example, and as described above, cells 402a–402g may be identified when the circuit designer selects input port identifier that corresponds to input port "A" for the base objects 400a–400g. These source leaf cells 402a–402g may then be aligned. However, rather than selecting another input port identifier for the current base objects 400a–400g, the circuit designer may elect to selectively make the identified source leaf cells 402a–402g the new base objects, preferably using the menu options of menu 326. Then, the above-described process may be repeated to identify the source leaf cells that drive a selected input port of the new base objects 402a–402g. Again, for placed source leaf cells, the "align to datapath base" menu option of menu 322 of FIG. 5 may be used to align the identified source leaf cells along an axis that is parallel to the dominate axis 414 of the new base objects 402a–402g. For unplaced source leaf cells, the tool preferably automatically aligns the cells along axis 412. This process may continue until, for example, all of the leaf cells that drive one or more of the input ports of the new base objects are identified, placed and aligned.

As can be seen, the above described process may provide a circuit designer with an efficient way to traverse, place and/or align various leaf cells of a circuit design. This may be particularly useful when analyzing or placing a data path structure. When, for example, the base objects are part of a data path, the identified source leaf cells that drive the identified input ports of the base objects may be part of a previous stage of the data path. Accordingly, using the above-described methods, a circuit designer may easily traverse back through the data path to evaluate the placement of the various cells of the data path, and if desired, place and align the leaf cells of the data path.

Figure 9:
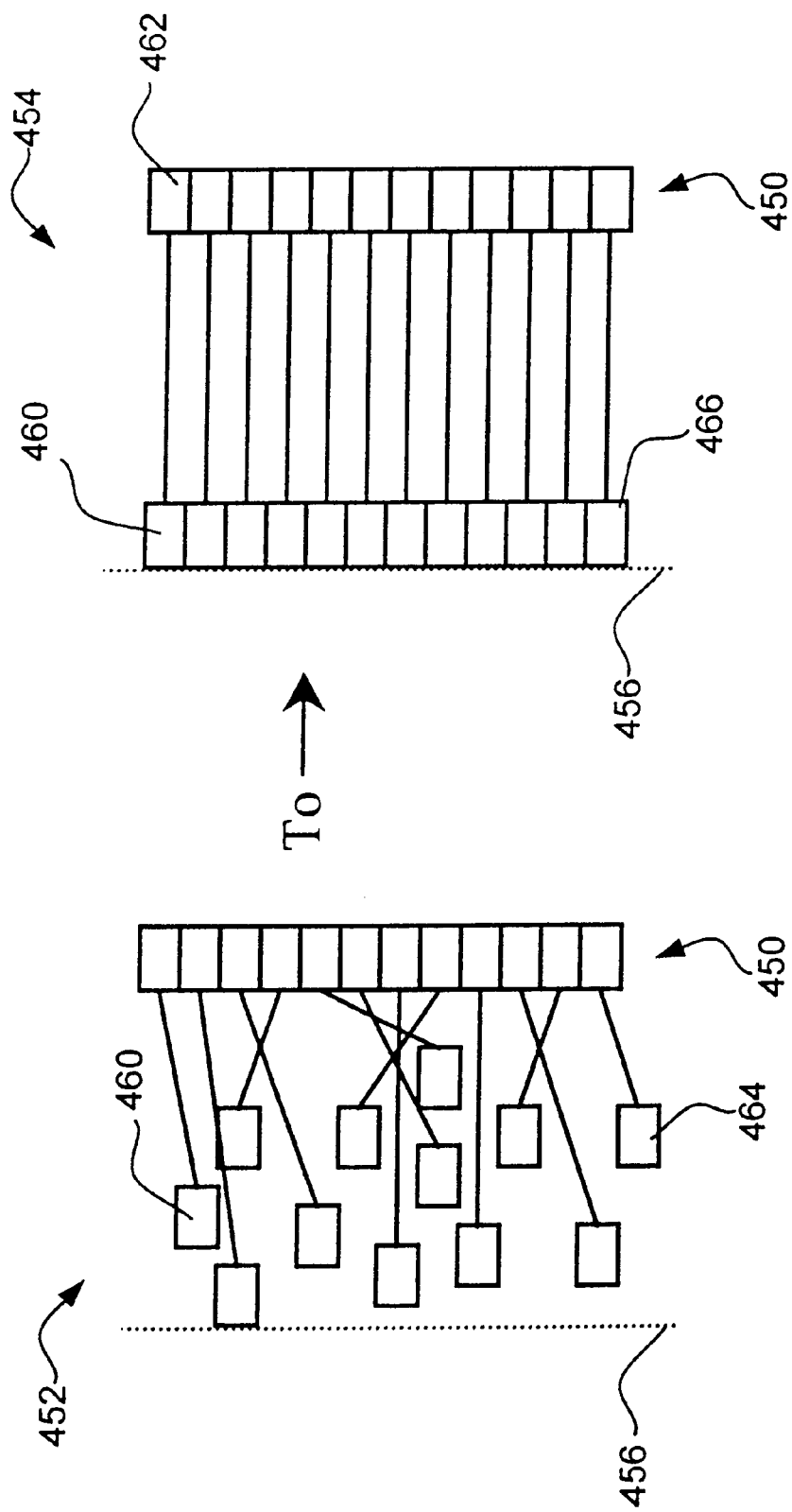
FIG. 9 is a schematic diagram illustrating the "align to datapath base" menu option of FIG. 5.

FIG. 9 is a schematic diagram illustrating the "align to datapath base" menu option of FIG. 5. The "align to datapath base" menu option preferably aligns selected placed cells in the direction of a dominate axis of the current base objects. In the diagram shown, the base objects are shown at 450. The selected placed cells are shown as source leaf cells that have an output port connected to an identified input port of the base objects 450. Before the "align to datapath base" menu option is executed, the selected source leaf cells may be placed in an unaligned configuration, as generally shown at 452. However, after the "align to datapath base" menu option is executed, the selected source leaf cells are placed in an aligned configuration, as generally shown at 454. The selected source leaf cells are preferably placed along (parallel with) the predominate axis 456 of the base objects 450. In a preferred embodiment, the "align to datapath base" menu option aligns the selected source leaf cells along an axis 456 that extends from the left side of the left most placed cell, as shown.

In addition to aligning the selected source leaf cells along the predominate axis of the base objects 450, the "align to datapath base" menu option also may order the selected source leaf cells in the same order as the corresponding base objects. That is, the source leaf cell 460 that is connected to the top base object is placed on top 462, and the source leaf cell 464 that is connected to the bottom base object 466 is placed on the bottom. This may allow optimum connectivity between corresponding source leaf cells and base objects.

Figure 10A:
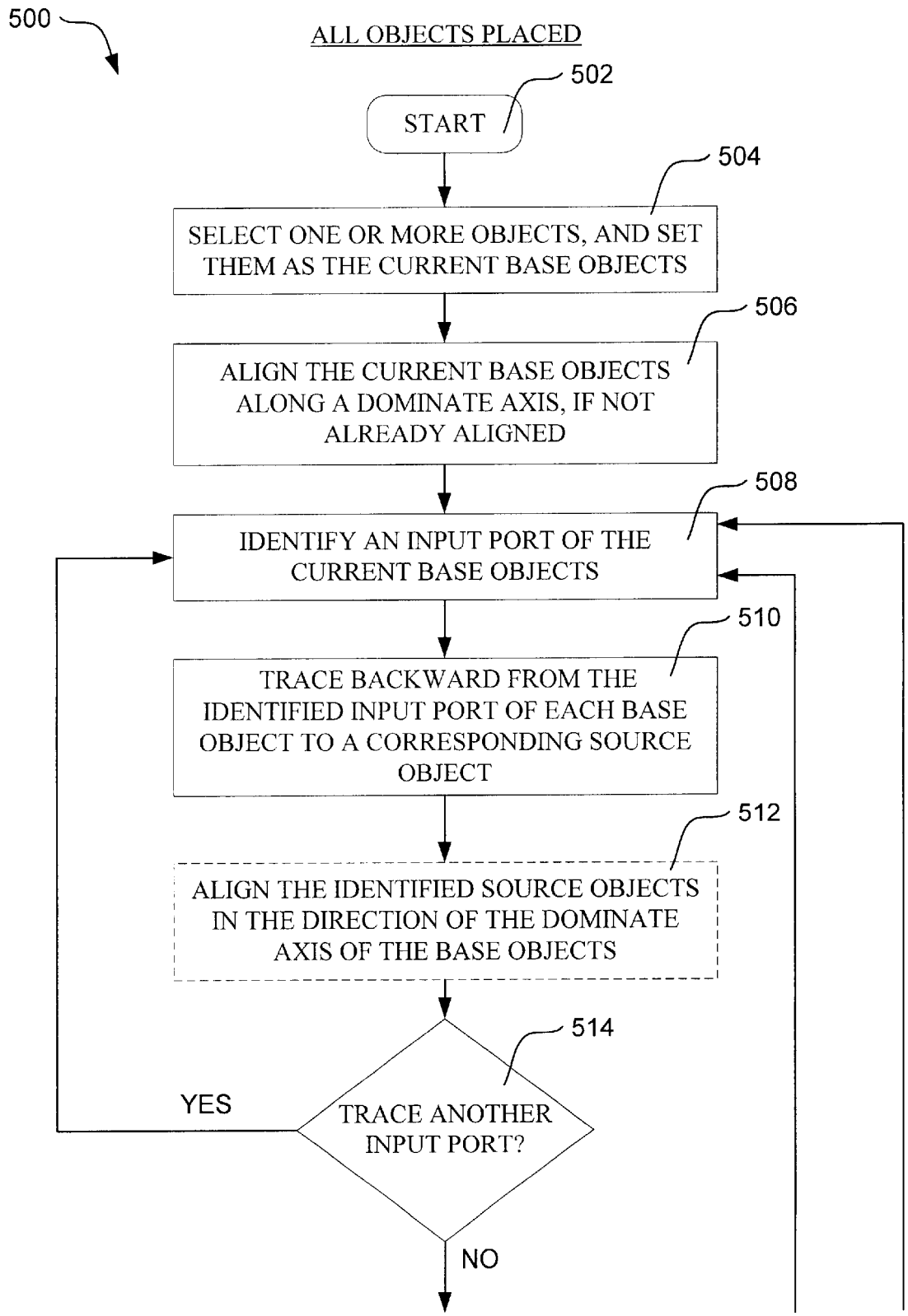
FIGS. 10A–10B show a flow diagram of an illustrative method of the present invention for tracing backward through a circuit design, assuming all objects are placed.
Figure 10B:
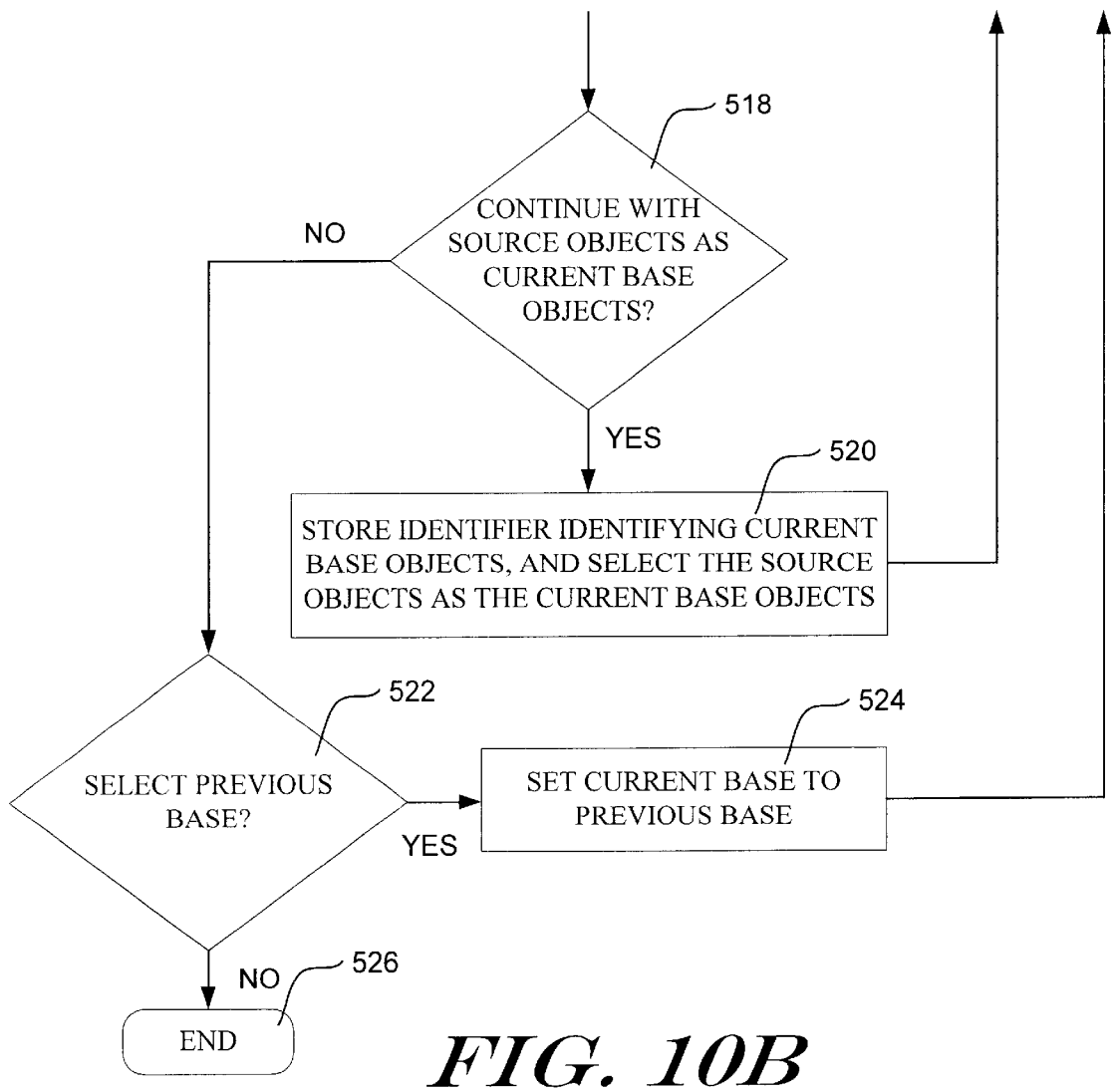

FIGS. 10A–10B show a flow diagram of an illustrative method of the present invention for tracing backward through a circuit design, assuming all objects are placed. The illustrative method is generally shown at 500, and is entered at step 502. Control is passed to step 504, wherein one or more base objects are selected as the current base objects. Once selected, the current base objects are aligned in the direction of a dominate axis, if not already aligned as shown at 506. Control is then passed to step 508.

At step 508, a circuit designer preferably identifies an input port of one or more of the current base objects. Once selected, the placement tool may trace backward from the identified input port of each base object to a corresponding source object, as shown at 510. If desired, the identified source objects may then be aligned in the direction of the dominate axis of the current base objects, as shown at step 512. Step 512 may be omitted if the circuit designer is merely evaluating the placement of the circuit design. Control is then passed to step 514.

Step 514 determines if the circuit designer wishes to identify and trace another input port of the current base objects. If the circuit designer wishes to trace another input port of the current base objects, control is passed back to step 508. If, however, the circuit designer does not wish to trace another input port of the current base objects, control is passed to step 518 of FIG. 10B.

Step 518 determines if the circuit designer wishes to set the identified source objects as the new or current base objects. If the circuit designer wishes to set the identified source objects as the new or current base objects, control is passed to step 520. Step 520 stores an identifier identifying the current base objects, and sets the identified source objects as the new or current base objects. Control is then passed back to step 508 of FIG. 10A. If the circuit designer does not wish to set the identified source objects as the new or current base objects, control is passed to step 522.

Step 522 determines if the circuit designer would like to revert back to a previous base. If the circuit designer wishes to revert to the previous base, control is passed to step 524. Step 524 sets the current base to the previous base, and control is passed back to step 508. If the circuit designer does not wish to revert back to the previous base, control s passed to step 526, wherein the algorithm is exited.

Figure 11A:
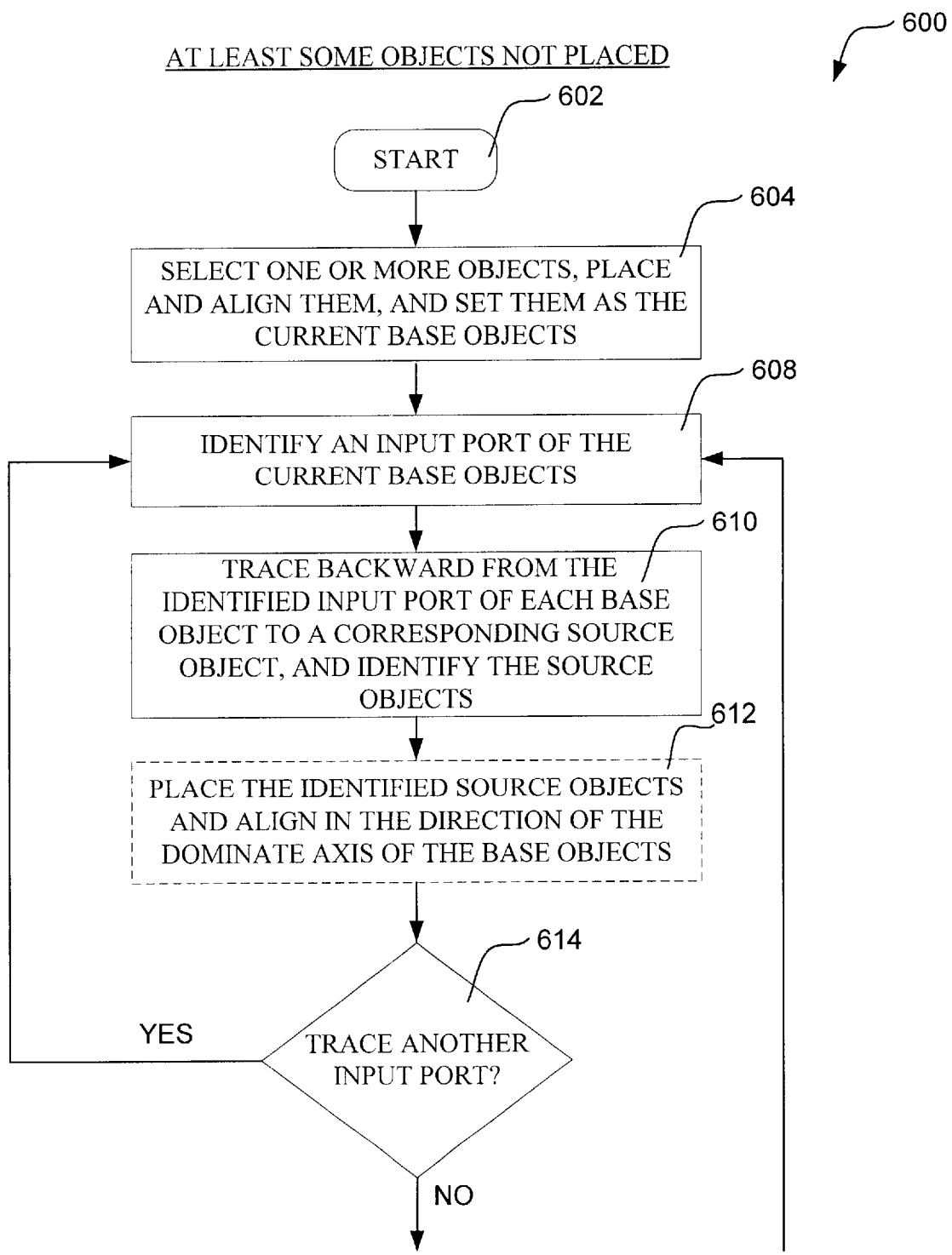
FIGS. 11A–11B show a flow diagram of another illustrative method of the present invention for tracing backward through a circuit design, assuming at least some of the objects are unplaced.
Figure 11B:
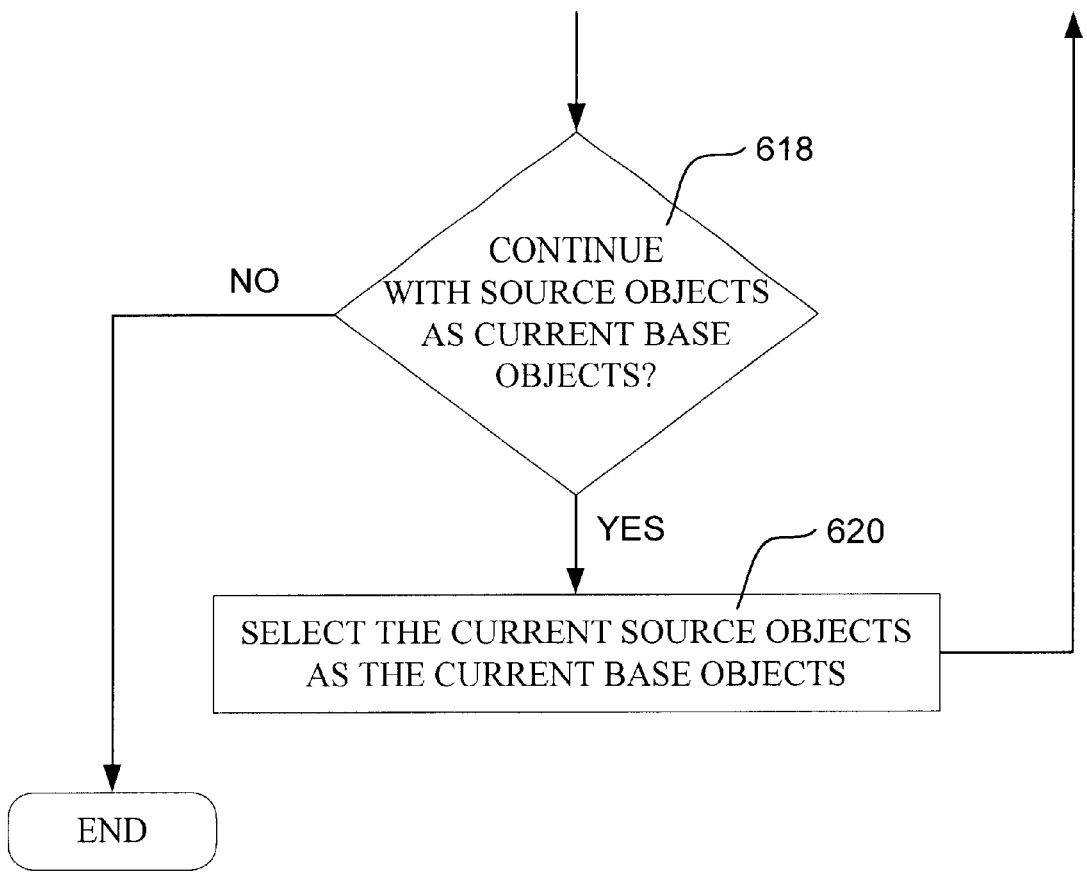

FIGS. 11A–11B show a flow diagram of another illustrative method of the present invention for tracing backward through a circuit design, assuming at least some of the objects are unplaced. The illustrative method is generally shown at 600, and is entered at step 602. Control is passed to step 604. Step 604 selects one or more objects, which are then placed, aligned, and set as the current base objects.

At step 608, a circuit designer identifies an input port of one or more of the current base objects. Once selected, the placement tool may trace backward from the identified input port of each base object to a corresponding source object, as shown at 610. If desired, the identified source objects may then be placed and aligned in the direction of the dominate axis of the current base objects, as shown at step 512. Step 512 may be omitted if the circuit designer is merely evaluating the connectivity of the circuit design. Control is then passed to step 614.

Step 614 determines if the circuit designer wishes to identify and trace another input port of the current base objects. If the circuit designer wishes to trace another input port of the current base objects, control is passed back to step 608. If, however, the circuit designer does not wish to trace another input port of the current base objects, control is passed to step 618 of FIG. 11B.

Step 618 determines if the circuit designer wishes to set the identified source objects as the new or current base objects. If the circuit designer wishes to set the identified source objects as the new or current base objects, control is passed to step 620. Step 620 sets the identified source objects as the new or current base objects, and control is passed back to step 608 of FIG. 11A. If the circuit designer does not wish to set the identified source objects as the new or current base objects, control is passed to step 622 wherein the method is exited.

Figure 12A:
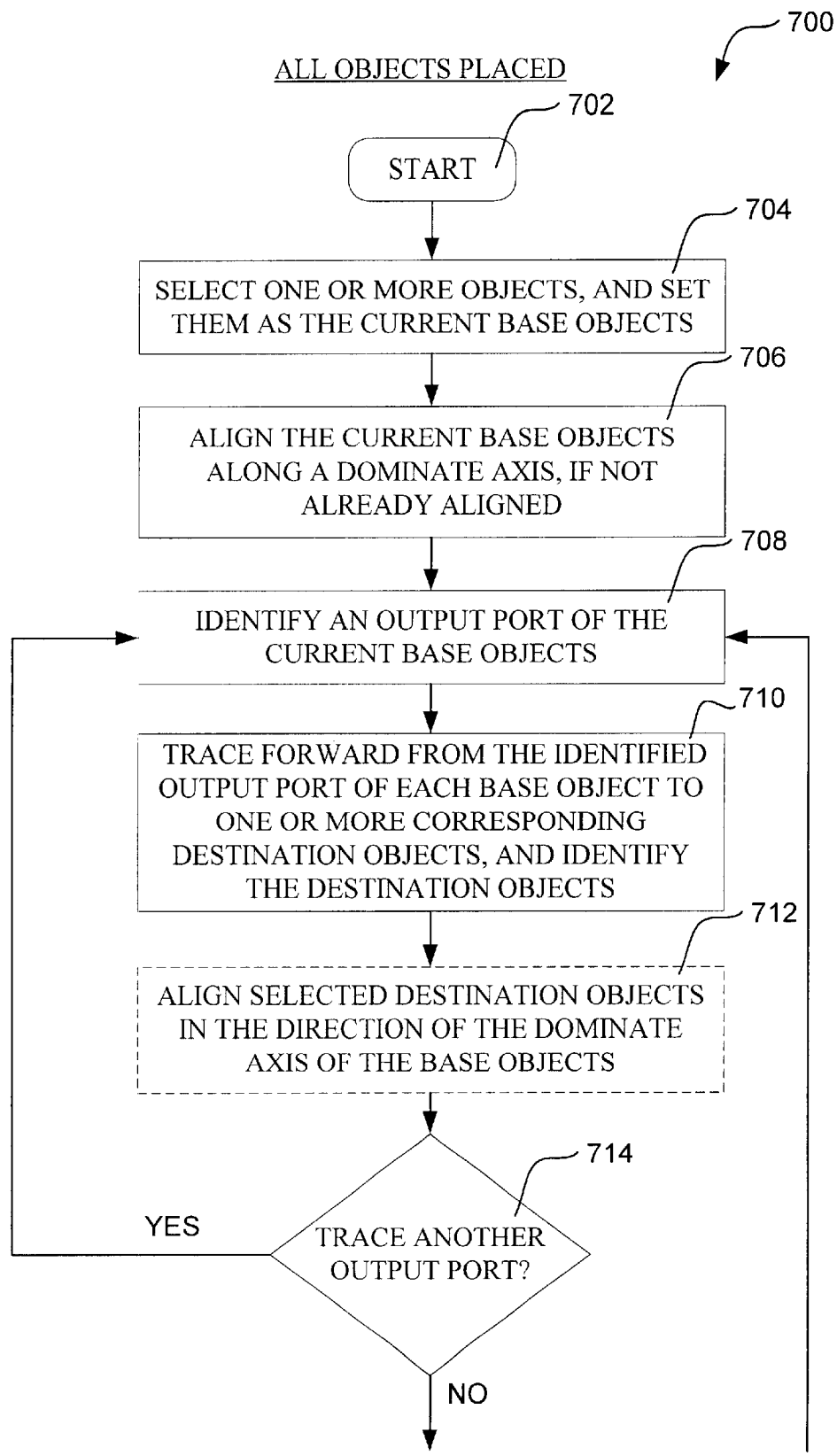
FIGS. 12A–12B show a flow diagram of an illustrative method of the present invention for tracing forward through a circuit design, assuming all objects are placed.
Figure 12B:
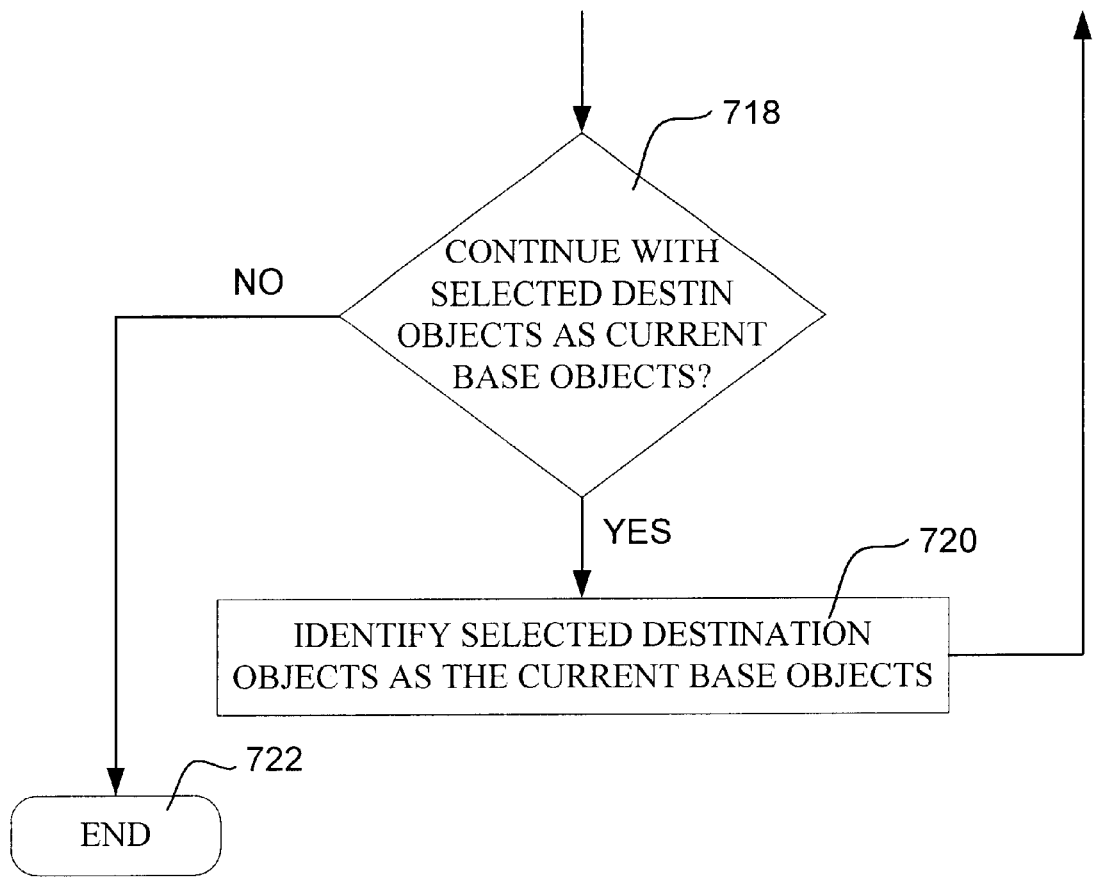

FIGS. 12A–12B show a flow diagram of an illustrative method of the present invention for tracing forward through a circuit design, assuming all objects are placed. The illustrative method is generally shown at 700, and is entered at step 702. Control is passed to step 704, wherein one or more base objects are selected as the current base objects. Once selected, the current base objects are aligned in the direction of a dominate axis, if not already aligned as shown at 706. Control is then passed to step 708.

At step 708, a circuit designer preferably identifies an output port of one or more of the current base objects. Once selected, the placement tool may trace forward from the identified output port of each base object to a corresponding destination object, as shown at 510. If desired, the identified destination objects may then be aligned in the direction of the dominate axis of the current base objects, as shown at step 712.

In some cases, more than one destination object will be identified as being connected to the identified output port of selected base objects. If this occurs, a selected destination object is preferably selected for each base object. The aligning step 712 may then align the selected destination objects along the dominate axis of the base objects. The aligning step 712 may then align the remaining destination objects adjacent to the corresponding selected destination object, along an axis that is substantially perpendicular to the dominate axis of the base objects. This provides an efficient method for automatically placing multiple destination objects in a pseudo array configuration. Step 712 may be omitted if the circuit designer is merely evaluating the placement of the circuit design. Control is then passed to step 714.

Step 714 determines if the circuit designer wishes to identify and trace another output port of the current base objects. If the circuit designer wishes to trace another output port of the current base objects, control is passed back to step 708. If, however, the circuit designer does not wish to trace another output port of the current base objects, control is passed to step 718 of FIG. 12B.

Step 718 determines if the circuit designer wishes to set the identified destination objects as the new or current base objects. If the circuit designer wishes to set the identified destination objects as the new or current base objects, control is passed to step 720. Step 720 sets the identified destination objects as the new or current base objects, and control is passed back to step 708 of FIG. 12A. If the circuit designer does not wish to set the identified destination objects as the new or current base objects, control is passed to step 722 wherein the method is exited.

Figure 13A:
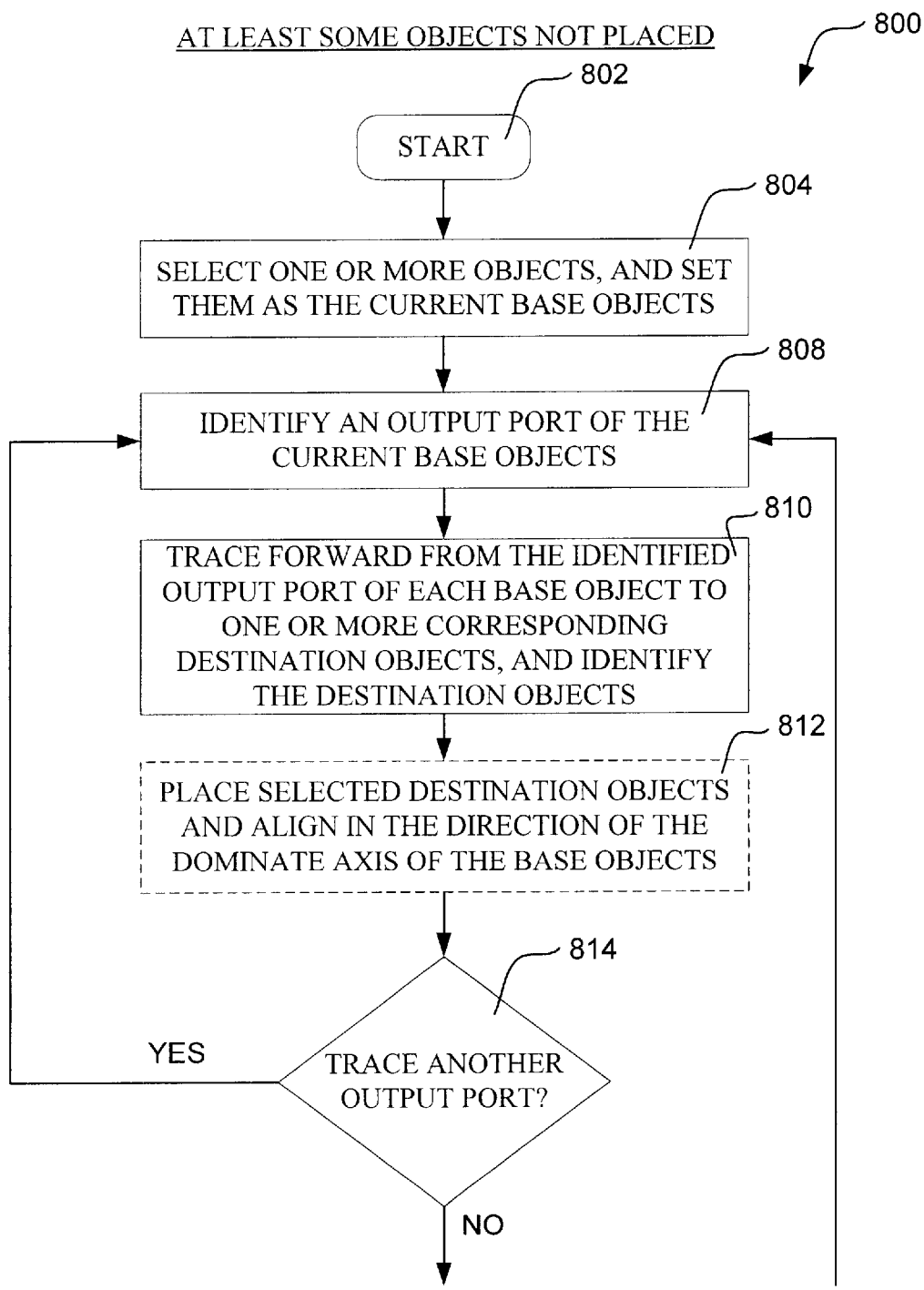
FIGS. 13A–13B show a flow diagram of another illustrative method of the present invention for tracing forward through a circuit design, assuming at least some of the objects are unplaced.
Figure 13B:
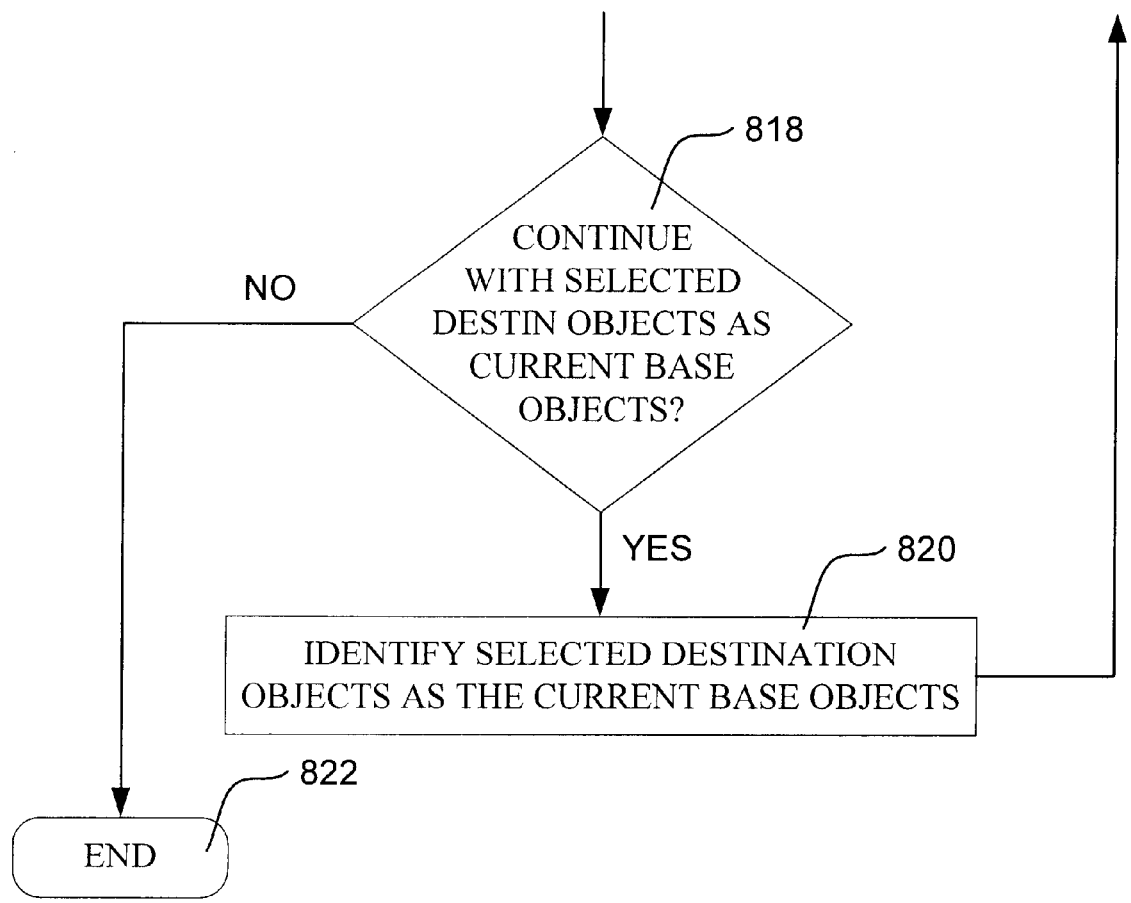

FIGS. 13A–13B show a flow diagram of another illustrative method of the present invention for tracing forward through a circuit design, assuming at least some of the objects are unplaced. The illustrative method is generally shown at 800, and is entered at step 802. Control is passed to step 804, wherein one or more base objects are selected, placed, aligned and set as the current base objects. Control is then passed to step 808.

At step 808, a circuit designer preferably identifies an output port of one or more of the current base objects. Once selected, the placement tool may trace forward from the identified output port of each base object to a corresponding destination object, as shown at 810. If desired, the identified destination objects may then be placed aligned in the direction of the dominate axis of the current base objects, as shown at step 812.

In some cases, more than one destination object will be identified as being connected to the identified output port of selected base objects. If this occurs, a selected destination object is preferably selected for each base object. The aligning step 812 may then place and align the selected destination objects along the dominate axis of the base objects. The aligning step 812 may then align the remaining destination objects adjacent to the corresponding selected destination object but spaced therefrom, and along an axis that is substantially perpendicular to the dominate axis of the base objects. This provides an efficient method for automatically placing multiple destination objects in a pseudo array configuration. Step 812 may be omitted if the circuit designer is merely evaluating the connectivity of the circuit design. Control is then passed to step 814.

Step 814 determines if the circuit designer wishes to identify and trace another output port of the current base objects. If the circuit designer wishes to trace another output port of the current base objects, control is passed back to step 808. If, however, the circuit designer does not wish to trace another output port of the current base objects, control is passed to step 818 of FIG. 13B.

Step 818 determines if the circuit designer wishes to set the identified destination objects as the new or current base objects. If the circuit designer wishes to set the identified destination objects as the new or current base objects, control is passed to step 820. Step 820 sets the identified destination objects as the new or current base objects, and control is passed back to step 808 of FIG. 13A. If the circuit designer does not wish to set the identified destination objects as the new or current base objects, control is passed to step 822 wherein the method is exited.

Having thus described the preferred embodiments of the present invention, those of skill in the art will readily appreciate that the teachings found herein may be applied to yet other embodiments within the scope of the claims hereto attached.

What is claimed is:

1. A method for identifying cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets connecting an output port of a source leaf cell to an input port of one or more destination leaf cells, the method comprising the steps of:

selecting one or more placed leaf cells as base objects;
   identifying an input port of selected base objects;
   selecting one or more source leaf cells in the circuit design database that have an output port connected to the identified input port of the selected base objects; and
   performing a placement function on selected ones of the selected source leaf cells.

2. A method according to claim 1, further comprising the steps of:

identifying another input port of selected base objects; and
   selecting one or more source leaf cells in the circuit design database that have an output port connected to the new identified input port of the selected base objects.

3. A method according to claim 1, further comprising the steps of:

selecting the one or more source leaf cells in the circuit design database that have an output port connected to the identified input port of the selected base objects as the new base objects;
   identifying an input port of selected ones of the new base objects; and
   selecting one or more source leaf cells in the circuit design database that have an output port connected to the identified input port of the selected new base objects.

4. A method according to claim 1, wherein the selecting step includes the steps of:

selecting one or more of the nets;
   identifying selected placed leaf cells that are connected to the selected one or more nets; and
   selecting the identified placed leaf cells.

5. A method for identifying cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets connecting an output port of a source leaf cell to an input port of one or more destination leaf cells, the method comprising the steps of:

selecting one or more placed leaf cells as base objects;
   identifying an output port of selected base objects;
   selecting one or more destination leaf cells in the circuit design database that have an input port connected to the identified output port of the selected base objects; and
   performing a placement function on selected ones of the selected destination leaf cells.

6. A method according to claim 5, further comprising the steps of:

identifying another output port of selected base objects; and
   selecting one or more destination leaf cells in the circuit design database that have an input port connected to the new identified output port of the selected base objects.

7. A method according to claim 5, further comprising the steps of:

selecting the one or more destination leaf cells in the circuit design database that have an input port connected to the identified output port of the selected base objects as the new base objects;
   identifying an output port of selected ones of the new base objects; and
   selecting one or more destination leaf cells in the circuit design database that have an input port connected to the identified output port of the selected new base objects.

8. A method for aligning cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets connecting an output port of a source leaf cell to an input port of one or more destination leaf cells, the method comprising the steps of:

selecting one or more leaf cells as base objects;
   aligning the base objects in the direction of a predetermined dominate axis, if not already aligned;
   identifying an input port of selected base objects;
   identifying one or more source leaf cells in the circuit design database that have an output port connected to the identified input port of the selected base objects; and
   aligning the identified source leaf cells in the direction of the predetermined dominate axis of the base objects.

9. A method according to claim 8, wherein each of the leaf cells in the circuit design database is either placed or unplaced, the aligning step further including the step of placing the base objects if not already placed.

10. A method according to claim 8, wherein the selecting step includes the steps of:

selecting one or more of the nets;
   identifying selected leaf cells that are connected to the selected one or more nets; and:
   selecting the identified placed leaf cells as the base objects.

11. A method according to claim 8, further comprising the steps of:
deselecting the selected input port of the selected base objects;
identifying another input port of selected base objects;
identifying one or more source leaf cells in the circuit design database that have an output port connected to the new identified input port of the selected base objects; and
aligning the identified source leaf cells in the direction of the predetermined dominate axis of the base objects.

12. A method according to claim 11, wherein each of the leaf cells in the circuit design database is either placed or unplaced, the aligning step further including the step of placing the base objects if not already placed.

13. A method according to claim 8, further comprising the steps of:
selecting the one or more source leaf cells in the circuit design database that have an output port connected to the identified input port of the selected base objects as the new base objects;
identifying an input port of selected ones of the new base objects;
identifying one or more source leaf cells in the circuit design database that have an output port connected to the identified input port of the selected new base objects; and
aligning the identified source leaf cells in the direction of the predetermined dominate axis of the new base objects.

14. A method according to claim 13, wherein each of the leaf cells in the circuit design database is either placed or unplaced, the aligning step further including the step of placing the base objects if not already placed.

15. A method for aligning cells in a circuit design database using a placement tool, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets connecting an output port of a source leaf cell to an input port of one or more destination leaf cells, the method comprising the steps of:
selecting one or more leaf cells as base objects;
aligning the base objects in the direction of a predetermined dominate axis, if not already aligned;
identifying an output port of selected base objects;
identifying one or more-destination leaf cells in the circuit design database that have an input port connected to the identified output port of the selected base objects; and
aligning the identified destination leaf cells in the direction of the predetermined dominate axis of the base objects.

16. A method according to claim 15, wherein each of the leaf cells in the circuit design database is either placed or unplaced, the aligning step further including the step of placing the base objects if not already placed.

17. A method according to claim 15, wherein the selecting step includes the steps of:
selecting one or more of the nets;
identifying selected leaf cells that are connected to the selected one or more nets; and
selecting the identified placed leaf cells as the base objects.

18. A method according to claim 15, wherein each of the identified destination leaf cells is associated with one of the base objects, the aligning step putting a selected destination leaf cell for each base object into a predetermined order along the dominate axis, and putting the remaining destination leaf cells adjacent the corresponding selected destination leaf cell along an axis that is perpendicular to the dominate axis.

19. A method according to claim 15, further comprising the steps of:
deselecting the selected output port of the selected base objects;
identifying another output port of selected base objects;
identifying one or more destination leaf cells in the circuit design database that have an input port connected to the new identified output port of the- selected base objects; and
aligning the identified destination leaf cells in the direction of the predetermined dominate axis of the base objects.

20. A method according to claim 19, wherein each of the leaf cells in the circuit design database is either placed or unplaced, the aligning step further including the step of placing the base objects if not already placed.

21. A method according to claim 15, further comprising the steps of:
selecting the one or more destination leaf cells in the circuit design database that have an input port connected to the identified output port of the selected base objects as the new base objects;
identifying an output port of selected ones of the new base objects;
identifying one or more destination leaf cells in the circuit design database that have an input port connected to the identified output port of the selected new base objects; and
aligning the identified destination leaf cells in the direction of the predetermined dominate axis of the new base objects.

22. A method according to claim 21, wherein each of the leaf cells in the circuit design database is either placed or unplaced, the aligning step further including the step of placing the base objects if not already placed.

23. A data processing system for identifying cells in a circuit design database, the circuit design database having one or more levels of hierarchy including one or more logic functions composed of one or more other logic functions and/or one or more leaf cells, the leaf cells forming the lowest level of hierarchy in the circuit design database, each of the leaf cells having one or more inputs and one or more outputs, the circuit design database having one or more nets, each of the nets connecting an output port of a source leaf cell to an input port of one or more destination leaf cells, the data processing system comprising:
selecting means for selecting one or more leaf cells as base objects;
input port identifying means for identifying an input port of selected base objects;
leaf cell selecting means for identifying one or more source leaf cells in the circuit design database that have an output port connected to the identified input port of the selected base objects; and
placement function means for performing a placement function on selected ones of the selected source leaf cells.

24. A data processing system according to claim 23, wherein said selecting means, said input port identifying means, said leaf cell identifying means, and said placement function means are controlled by a controller.

25. A data processing system according to claim 24, wherein said controller accepts input from a user input device.

26. A data processing system according to claim 25, wherein said controller, upon command, directs said input port identifying means to identify another input port of selected base objects, and further directs said leaf cells selecting means to select one or more source leaf cells in the circuit design database that have an output port connected to the new identified input port of the selected base objects.

27. A data processing system according to claim 25, further comprising:

selecting means for selecting the one or more source leaf cells in the circuit design database that have an output port connected to the identified input port of the selected base objects as the new base objects;

said controller directing said input port identifying means to identify an input port of selected ones of the new base objects; and said controller also directing said leaf cell selecting means to select one or more source leaf cells in the circuit design database that have an output port connected to the identified input port of the selected new base objects.

28. A data processing system according to claim 25, further comprising:

base object aligning means for aligning the base objects in the direction of a predetermined dominate axis, if not already aligned; and source aligning means for aligning the identified source leaf cells in the direction of the predetermined dominate axis of the base objects.

29. A data processing system according to claim 28, wherein said base object aligning means an said source aligning means are also controlled by said controller.

* * * * *